(12) United States Patent
Lee et al.

(10) Patent No.: US 10,978,669 B2
(45) Date of Patent: Apr. 13, 2021

(54) DISPLAY DEVICE AND METHOD OF MANUFACTURING DISPLAY DEVICE

(71) Applicant: Samsung Display Co., Ltd., Yongin-Si (KR)

(72) Inventors: Jihwang Lee, Yongin-si (KR); Youngseo Choi, Yongin-si (KR); Munhwa Song, Yongin-si (KR); Yonghyuck Lee, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/127,133

(22) Filed: Sep. 10, 2018

(65) Prior Publication Data
US 2019/0207155 A1  Jul. 4, 2019

(30) Foreign Application Priority Data
Dec. 29, 2017 (KR) ........................ 10-2017-0184805

(51) Int. Cl.
*H01L 51/52* (2006.01)
*H01L 51/56* (2006.01)
*H01L 27/32* (2006.01)
*H01L 27/12* (2006.01)

(52) U.S. Cl.
CPC .......... *H01L 51/5253* (2013.01); *H01L 51/56* (2013.01); *H01L 27/1214* (2013.01); *H01L 27/3246* (2013.01); *H01L 27/3262* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 7,928,646 B2* | 4/2011 | Ryuji | H01L 27/322 313/501 |
| 8,492,974 B2* | 7/2013 | Lee | H01L 51/5256 313/506 |
| 8,987,717 B2* | 3/2015 | Kang | H01L 51/52 257/40 |
| 9,419,062 B2* | 8/2016 | Park | H01L 51/5012 |
| 9,627,647 B2* | 4/2017 | Kim | H01L 51/5253 |
| 10,115,776 B2* | 10/2018 | Park | H01L 51/5012 |
| 10,135,011 B2* | 11/2018 | Park | H01L 51/5253 |
| 10,727,442 B2* | 7/2020 | Wang | H01L 51/5256 |
| 2008/0211399 A1 | 9/2008 | Ryuji et al. | |

(Continued)

OTHER PUBLICATIONS

N. Wagner, P. Theato / Polymer 55 (2014) 3436-3453.

*Primary Examiner* — David E Graybill
(74) *Attorney, Agent, or Firm* — Innovation Counsel LLP

(57) ABSTRACT

A display device is provided. The display device includes: a substrate; a driving thin film transistor disposed over the substrate; a pixel electrode electrically connected to the driving thin film transistor; a pixel-defining layer including an opening overlapping the pixel electrode; an intermediate layer overlapping a portion of the pixel electrode exposed through the opening, the intermediate layer including an emission layer; an opposite electrode disposed on the intermediate layer; an organic control layer disposed on the opposite electrode, the organic control layer having hydrophilicity; an organic encapsulation layer disposed on the organic control layer; and at least one inorganic encapsulation layer overlapping the organic encapsulation layer.

19 Claims, 21 Drawing Sheets

(56) References Cited

U.S. PATENT DOCUMENTS

| | | | |
|---|---|---|---|
| 2012/0133275 A1* | 5/2012 | Lee | H01L 51/5256 |
| | | | 313/506 |
| 2013/0099659 A1* | 4/2013 | Park | H01L 51/56 |
| | | | 313/504 |
| 2014/0070175 A1* | 3/2014 | Kang | H01L 51/52 |
| | | | 257/40 |
| 2016/0093828 A1* | 3/2016 | Kim | H01L 51/5253 |
| | | | 257/40 |
| 2016/0126496 A1 | 5/2016 | Wang et al. | |
| 2016/0380036 A1* | 12/2016 | Park | H01L 27/3276 |
| | | | 257/40 |
| 2017/0279057 A1 | 9/2017 | Park et al. | |
| 2019/0207155 A1* | 7/2019 | Lee | H01L 51/5253 |

* cited by examiner

DISPLAY DEVICE AND METHOD OF MANUFACTURING DISPLAY DEVICE

CROSS-REFERENCE TO RELATED APPLICATION

This application claims the benefit of Korean Patent Application No. 10-2017-0184805 filed on Dec. 29, 2017 in the Korean Intellectual Property Office, the disclosure of which is incorporated herein in its entirety by reference.

BACKGROUND

1. Field

One or more embodiments relate to a display device and a method of manufacturing the display device.

2. Description of the Related Art

In the development of display devices visually displaying electric signals, various display devices are introduced to the market offering desirable characteristics such as slimness, light weight, low power consumption, etc. Recently, flexible display devices which are foldable or rollable are studied and developed, and furthermore, stretchable display devices which are changeable to various forms are being actively researched and developed.

SUMMARY

One or more embodiments include a display device including a thin encapsulation layer which is not damaged even when a shape of the display device changes and a method of manufacturing the display device. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments.

According to one or more embodiments, a display device includes: a substrate; a driving thin film transistor disposed over the substrate; a pixel electrode electrically connected to the driving thin film transistor; a pixel-defining layer including an opening overlapping the pixel electrode; an intermediate layer overlapping a portion of the pixel electrode exposed through the opening, the intermediate layer including an emission layer; an opposite electrode disposed on the intermediate layer; an organic control layer disposed on the opposite electrode, the organic control layer having hydrophilicity; an organic encapsulation layer disposed on the organic control layer; and at least one inorganic encapsulation layer overlapping the organic encapsulation layer.

The at least one inorganic encapsulation layer may include: a first inorganic encapsulation layer disposed between the opposite electrode and the organic control layer; and a second inorganic encapsulation layer disposed on the organic encapsulation layer such that the organic encapsulation layer is disposed between the first inorganic encapsulation layer and the second inorganic encapsulation layer.

The first inorganic encapsulation layer may contact the second inorganic encapsulation layer in a region adjoining an end of the organic encapsulation layer.

The display device may further include: an adjacent pixel electrode adjoining the pixel electrode; an adjacent intermediate layer disposed on the adjacent pixel electrode, the adjacent intermediate layer including an adjacent emission layer configured to emit light of color different from color of light emitted from the emission layer of the intermediate layer; and an adjacent opposite electrode disposed on the adjacent intermediate layer.

The display device may further include: an adjacent organic control layer disposed on the opposite electrode, the adjacent organic control layer having hydrophilicity; an adjacent organic encapsulation layer directly contacting the adjacent organic control layer; and at least one adjacent inorganic encapsulation layer overlapping the adjacent organic encapsulation layer, wherein the adjacent organic control layer and the organic control layer may be mutually spaced apart, and the adjacent organic encapsulation layer and the organic encapsulation layer may be mutually spaced apart.

The adjacent opposite electrode and the opposite electrode may be connected as one body.

The adjacent opposite electrode and the opposite electrode may be mutually spaced apart.

The at least one adjacent inorganic encapsulation layer and the at least one inorganic encapsulation layer may be connected as one body.

The at least one adjacent inorganic encapsulation layer and the at least one inorganic encapsulation layer may be mutually spaced apart.

According to one or more embodiments, a display device includes: a substrate; a plurality of unit displays disposed over the substrate, each including a pixel electrode, an intermediate layer, and an opposite electrode sequentially disposed, the intermediate layer including an emission layer; an organic control layer overlapping each of the unit displays, the organic control layer having hydrophilicity; an organic encapsulation layer directly contacting the organic control layer; and at least one inorganic encapsulation layer overlapping the organic encapsulation layer.

The at least one inorganic encapsulation layer may include: a first inorganic encapsulation layer disposed between each of the unit displays and the organic control layer; and a second inorganic encapsulation layer disposed on the organic encapsulation layer such that the organic encapsulation layer is disposed between the second inorganic encapsulation layer and the first inorganic encapsulation layer.

The organic encapsulation layer may include a plurality of sub-organic encapsulation layers corresponding to each of the unit displays.

According to one or more embodiments, a method of manufacturing a display device includes: forming, over a substrate, a thin film transistor and a pixel electrode electrically connected to the thin film transistor; forming a pixel-defining layer including an opening exposing the pixel electrode; forming an intermediate layer including an emission layer, the intermediate layer overlapping a portion of the pixel electrode exposed through the opening; forming an opposite electrode on the intermediate layer; forming an organic control layer on the opposite electrode, the organic control layer including a first region having hydrophilicity; forming an organic encapsulation layer on the first region; and forming at least one inorganic encapsulation layer overlapping the organic encapsulation layer.

The forming of the organic control layer may include: forming an organic material layer with light-tunable wettability; and forming the organic control layer by irradiating preset light onto a portion of the organic material layer, the organic control layer including a first region having hydrophilicity and a second region having hydrophobicity.

The method may further include: removing the second region.

The organic material layer may include an organic material including at least one of an azobenzene group, a spiropyran amine group, a 7-[(trifluoro methylphenylazo)phenoxy]pentanoic acid group, a cinnamate group, a trifluoromethanesulfonic acid trimethylsilylester group, a polyarylsulfone, a diarylethene group, a diethylcyclopentene group, a coumarin group, and an ortho-nitrobenzyl (ONB) ester group.

A width of the first region may be greater than a width of the opening.

The forming of the at least one inorganic encapsulation layer may include: forming a first inorganic encapsulation layer disposed between the opposite electrode and the organic control layer; and forming a second inorganic encapsulation layer on the organic encapsulation layer such that the organic encapsulation layer is disposed between the first inorganic encapsulation layer and the second inorganic encapsulation layer.

The method may further include: etching the at least one inorganic encapsulation layer such that the at least one inorganic encapsulation layer has an island shape.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
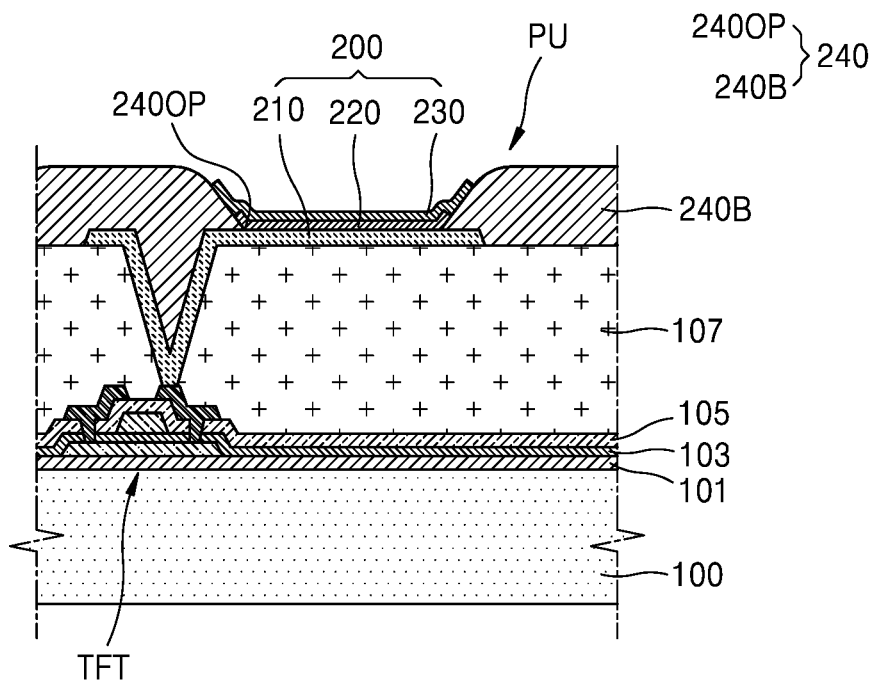
FIGS. 1A to 1H are cross-sectional views of processes of a method of manufacturing a display device according to an embodiment.

As the disclosure allows for various changes and numerous embodiments, example embodiments will be illustrated in the drawings and described in detail in the written description. An effect and a characteristic of the disclosure, and a method of accomplishing these will be apparent when referring to embodiments described with reference to the drawings. This disclosure may, however, be embodied in many different forms and should not be construed as limited to the example embodiments set forth herein.

Hereinafter, the disclosure will be described more fully with reference to the accompanying drawings, in which example embodiments of the disclosure are shown. When description is made with reference to the drawings, like reference numerals in the drawings denote like or corresponding elements, and repeated description thereof will be omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

In the following examples, the x-axis; the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Embodiments may easily control flowing of a monomer used during a process of forming an organic encapsulation layer, individually and/or independently seal a unit display, and efficiently distribute stress, etc. occurring while a shape of a display device changes. The above effects are provided as examples, and effects according to embodiments are described in detail through contents described below.

A display device according to embodiments is a device displaying an image. Though an organic light-emitting display device is described as an example, for convenience of description, a display device according to embodiments is not limited thereto. For example, the display device may be an inorganic light-emitting display.

In a display device according to embodiments, a unit encapsulation part is a stacked body including an organic control layer, an organic encapsulation layer, and at least one inorganic layer. The unit encapsulation part may be defined by the organic encapsulation layer, or the organic control layer and the organic encapsulation layer. The display device includes organic encapsulation layers patterned such that the organic encapsulation layers are mutually spaced apart. One unit encapsulation part may be understood to correspond to one organic encapsulation layer. The organic control layer is disposed under each of the organic encapsulation layers. Like the organic encapsulation layers, organic control layers may be disposed over the display device such that the organic control layers are mutually spaced apart.

FIGS. 1A to 1H are cross-sectional views of processes of a method of manufacturing a display device according to an embodiment. Though FIGS. 1A to 1H illustrate one unit display PU, for convenience of description, a display device according to an embodiment is a display device including a plurality of unit displays PU, and processes described below with reference to FIGS. 1A to 1H are equally performed on the plurality of unit displays PU.

Referring to FIG. 1A, a unit display PU is formed over a substrate 100. The unit display PU may include a display element 200 configured to emit red, green, blue, or white light. The display element 200 may be an organic light-emitting diode including a pixel electrode 210, an opposite electrode 230, and an intermediate layer 220 disposed therebetween. FIG. 1A illustrates that one display element 200 corresponds to one unit display PU.

The substrate 100 may include various materials such as a plastic material including polyethylene terephthalate (PET), polyethylene naphthalate (PEN), and polyimide (PI). A buffer layer 101 configured to prevent impurities from penetrating to a semiconductor layer of a thin film transistor TFT, a gate insulating layer 103 configured to insulate the semiconductor layer from a gate electrode of the thin film transistor TFT, an interlayer insulating layer 105 configured to insulate source/drain electrodes from the gate electrode of the thin film transistor TFT, an organic insulating layer 107 covering the thin film transistor TFT, the organic insulating layer 107 being a planarization layer having an approximately flat top surface, or other elements may be formed over the substrate 100.

The pixel electrode 210 is formed on the organic insulating layer 107. The pixel electrode 210 is electrically connected to the thin film transistor TFT through a contact hole in the organic insulating layer 107.

The pixel electrode 210 may be a reflective electrode. In an embodiment, the pixel electrode 210 may include a reflective layer including at least one of Ag, Mg, Al, Pt, Pd, Au, Ni, Nd, Ir, Cr, or a compound thereof, and a light transmissive electrode layer on the reflective layer. The light transmissive electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). For example, the pixel electrode 210 may include a multi-layer of ITO/Ag/ITO.

A pixel-defining layer 240 is formed on the pixel electrode 210. The pixel-defining layer 240 may include at least one organic insulating material such as PI, polyamide, an acrylic resin, benzo cyclobutene, or a phenol resin, and may be formed based on spin coating, etc. The pixel-defining layer 240 includes an opening 240OP exposing a predefined region of the pixel electrode 210, and a bank portion 240B disposed between adjacent organic light-emitting diodes.

The intermediate layer 220 is formed on a portion of the pixel electrode 210 exposed through the opening 240OP of the pixel-defining layer 240. The intermediate layer 220 includes an emission layer, for example, an organic emission layer, the emission layer emitting red, green, blue, or white light. Besides the emission layer, the intermediate layer 220 may further include at least one functional layer such as a hole transport layer (HTL), a hole injection layer (HIL), an electron transport layer (ETL), or an electron injection layer (EIL).

The opposite electrode 230 may be a light transmissive electrode. For example, the opposite electrode 230 may include a metal thin layer having a small work function and including at least one of Li, Ca, LiF/Ca, LiF/Al, Al, Ag, Mg, or a compound thereof, or may include a material such as ITO, IZO, ZnO, or $In_2O_3$. For example, the opposite electrode 230 may include an alloy of Ag and Mg.

Figure 1B:
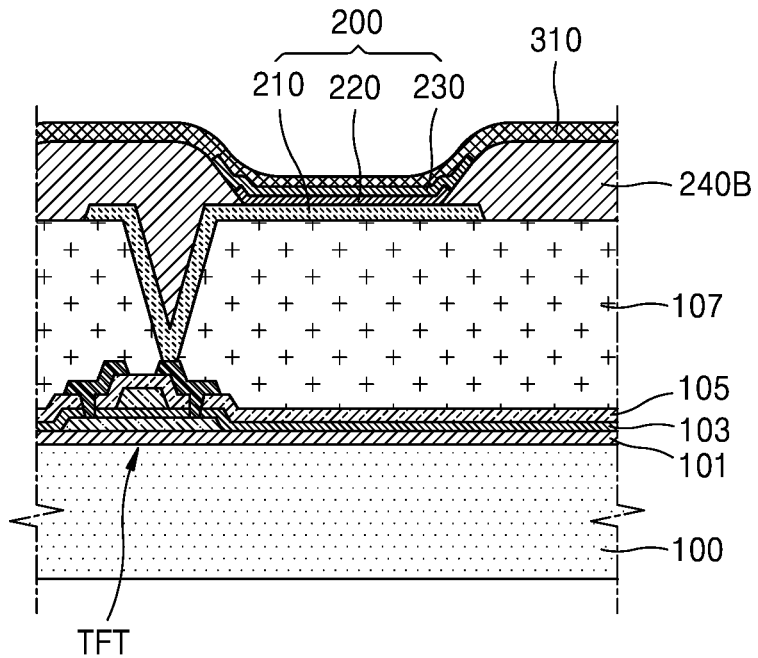

Referring to FIG. 1B, a first inorganic encapsulation layer 310 is formed on the display element. The first inorganic encapsulation layer 310 may include at least one of silicon nitride, aluminum nitride, zirconium nitride, titanium nitride, hafnium nitride, tantalum nitride, silicon oxide, aluminum oxide, titanium oxide, tin oxide, cesium oxide, or silicon oxynitride (SiON). The first inorganic encapsulation layer 310 may be formed to entirely cover the display element 200 based on chemical vapor deposition (CVD).

Before the first inorganic encapsulation layer 310 is formed, a process of forming a capping layer and/or a LiF layer may be further performed. The capping layer and/or LiF layer may protect the display element 200 from plasma, etc. occurring while the first inorganic encapsulation layer 310 is formed.

Figure 1C:
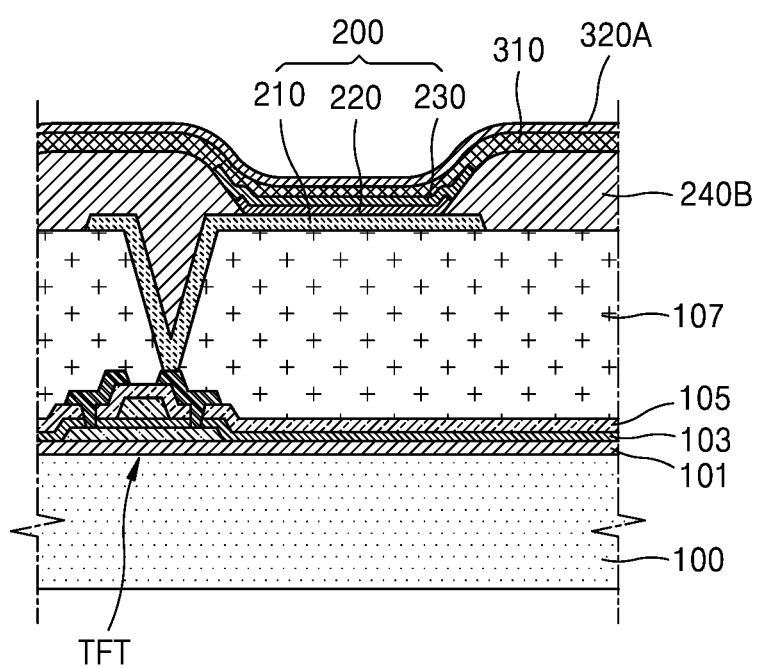

Referring to FIG. 1C, an organic material layer 320A with light-tunable wettability is formed on the first inorganic encapsulation layer 310. The organic material layer 320A may include an organic material including at least one of an azobenzene group, a spiropyran amine group, a 7-[(trifluoromethylphenylazo)phenoxy]pentanoic acid group, a cinnamate group, a trifluoromethanesulfonic acid trimethylsilylester group, a polyarylsulfone, a diarylethene group, a diethylcyclopentene group, a coumarin group, and an orthonitrobenzyl (ONB) ester group. The organic material layer 320A may be formed based on CVD.

Figure 1D:
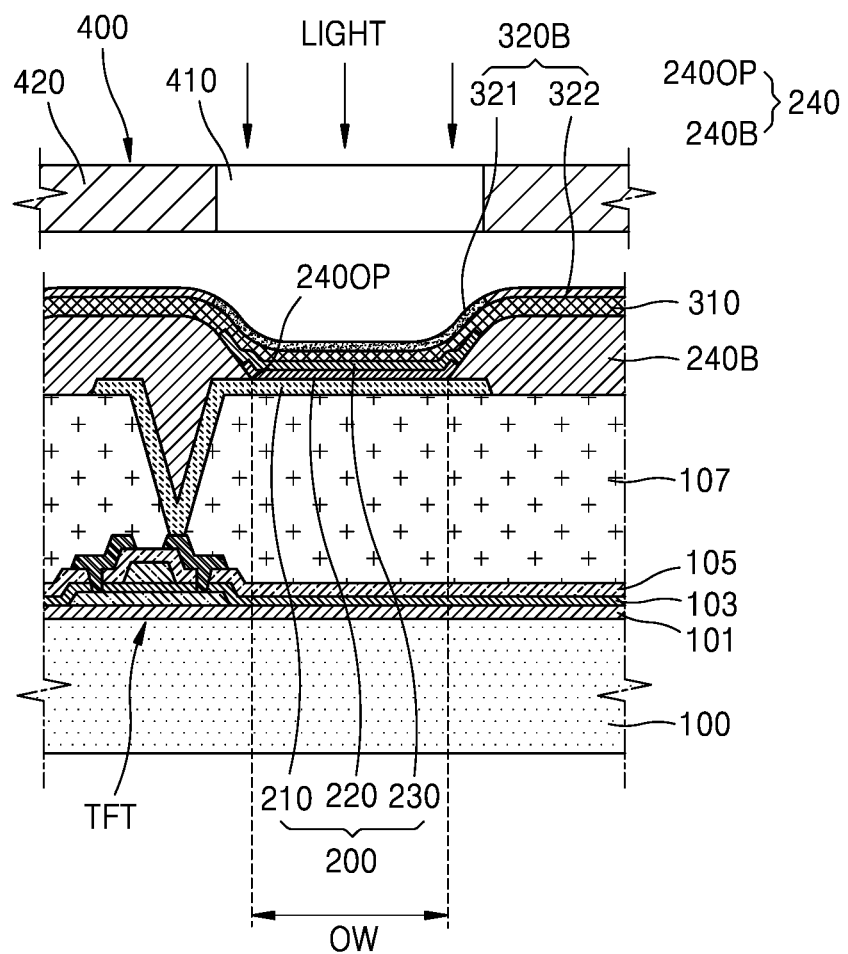

Referring to FIGS. 1C and 1D, preset light is irradiated onto a portion of the organic material layer 320A. For the light, an ultraviolet (UV) ray, a ray in a visible band, etc. may be selected depending on a kind of an organic material included in the organic material layer 320A.

In an embodiment, after a mask 400 including a light-transmissive portion 410 and a light-blocking portion 420 is disposed over the organic material layer 320A having hydrophobicity, when light is irradiated onto a partial region of the organic material layer 320A through the light-transmissive portion 410, the light-irradiated partial region may change to a hydrophilic region. Hereinafter, a layer including a hydrophobic region and a hydrophilic region by light is referred to as an organic control layer 320B. FIG. 1D illustrates that a first region 321 of the organic control layer 320B overlapping the display element 200 is hydrophilic, and a second region 322 not overlapping the display element 200 is hydrophobic. The first region 321 may have a width greater than a width OW of the opening 240OP of the pixel-defining layer 240, or a width of a portion of the pixel electrode 210 exposed through the pixel-defining layer 240.

According to an embodiment described with reference to FIGS. 1C and 1D, though the first region 321 of the organic material layer 320B is changed to a hydrophilic region by forming the organic material layer 320A having hydrophobicity, and irradiating light thereon, the present disclosure is not limited thereto. In another embodiment, a partial region (e.g. a region not overlapping the display element 200) of an organic material layer may be changed to a hydrophobic region by forming the organic material layer having hydrophilicity on the first inorganic encapsulation layer 310, and irradiating light onto the partial region of the organic material layer by using another mask. In this case, a location of a light-transmissive portion and a location of a light-blocking portion of the other mask may respectively correspond to a location of the light-blocking portion and a location of the light-transmissive portion of the mask 400 illustrated in FIG. 1D.

Figure 1E:
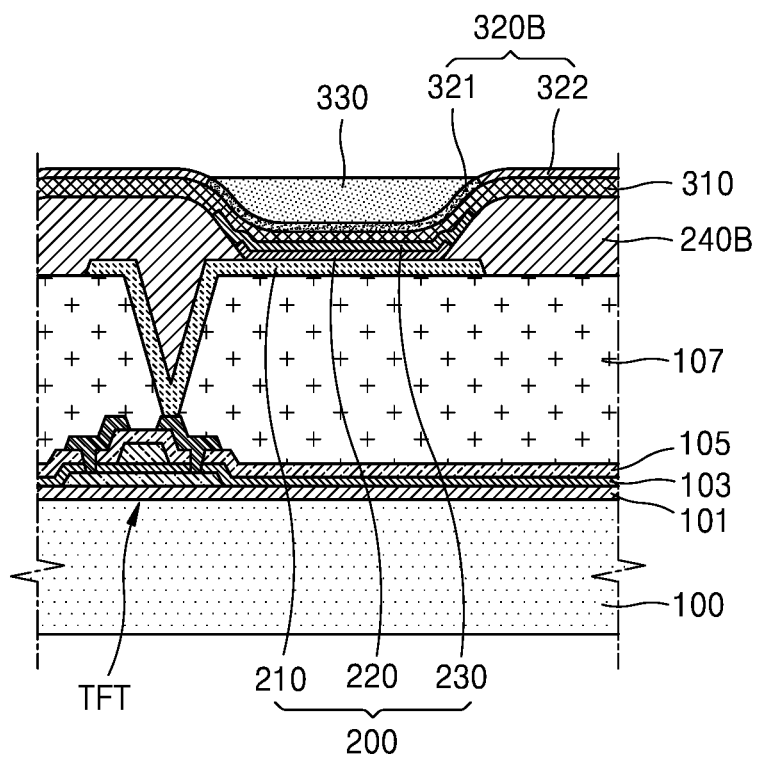

Referring to FIG. 1E, an organic encapsulation layer 330 is formed on the organic control layer 320B including the first region 321 having hydrophilicity and the second region 322 having hydrophobicity. The organic encapsulation layer 330 may be formed by coating a monomer through a method such as inkjet, etc., and hardening the monomer with heat or light. Since the monomer before hardening easily moves in the first region 321 but repulses against the second region 322, the monomer does not move to the second region 322. Therefore, the organic encapsulation layer 330 may be disposed in the first region 321 while contacting the first region 321 of the organic control layer 320B. That is, the organic control layer 320B including the first and second regions 321 and 322 having properties different from each other serves as a layer configured to control flowing of the monomer.

The organic encapsulation layer 330 may include polymethyl methacrylate (PMMA), polycarbonate (PC), polystyrene (PS), an acrylic-based resin, an epoxy-based resin, PI, and polyethylene.

Figure 1F:
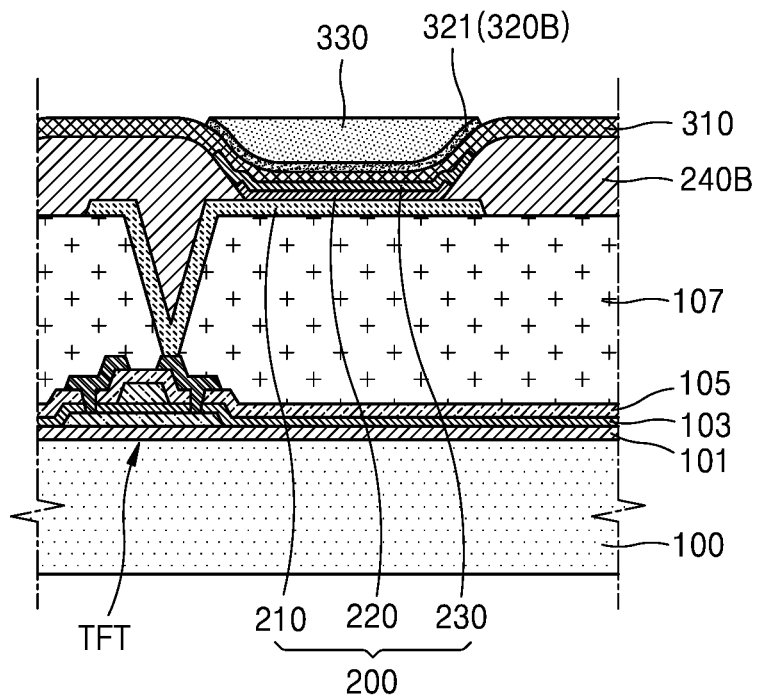

Referring to FIGS. 1E and 1F, the second region 322 of the organic control layer 320B is removed. Penetration of external foreign substances or moisture through an interface between the second region 322 and a layer(s) adjacent to the second region 322 may be prevented, and floating of the second region 322 may be prevented by removing the second region 322. FIG. 1F illustrates the organic control layer 320B including only the first region 321 with the second region 322 removed. Hereinafter, for convenience of description, to discriminate the organic control layer 320B (see FIG. 1F) after removal of the second region 322 from the organic control layer 320B before the removal of the second region 322, the organic control layer after a process of removing the second region 322 is described as an organic control layer "321".

Figure 1G:
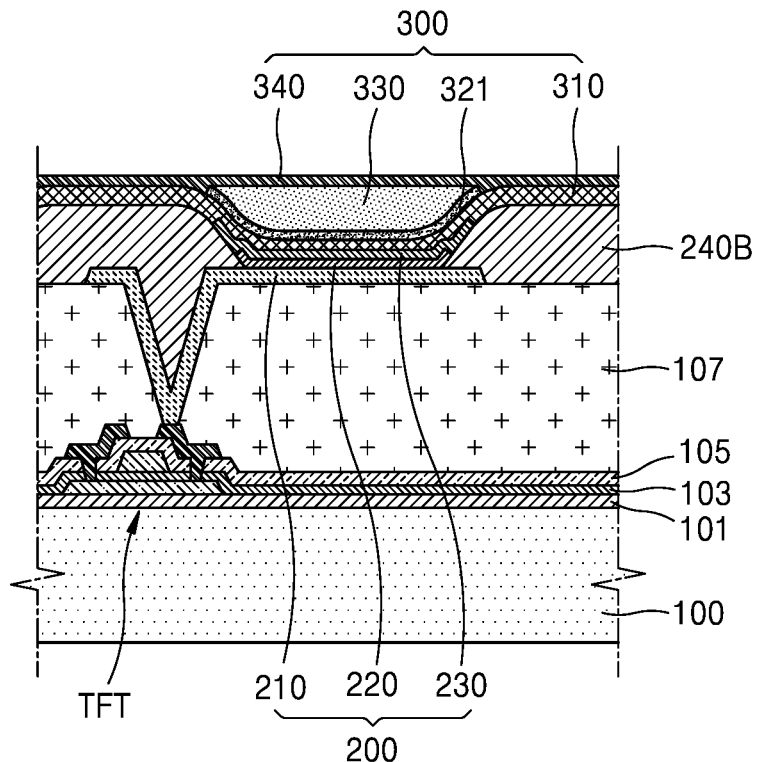

Referring to FIG. 1G, a second inorganic encapsulation layer 340 is formed on the organic encapsulation layer 330. The second inorganic encapsulation layer 340 may include at least one of silicon nitride, aluminum nitride, zirconium nitride, titanium nitride, hafnium nitride, tantalum nitride, silicon oxide, aluminum oxide, titanium oxide, tin oxide, cesium oxide, or silicon oxynitride (SiON). The second inorganic encapsulation layer 340 may be formed based on CVD.

The second inorganic encapsulation layer 340 may contact the organic encapsulation layer 330 and the first inorganic encapsulation layer 310. For example, the second inorganic encapsulation layer 340 may contact the first inorganic encapsulation layer 310 on the bank portion 240B of the pixel-defining layer 240. The first and second inorganic encapsulation layers 310 and 340 may prevent transmission of foreign substances such as moisture ($H_2O$) or oxygen ($O_2$).

A stacked body including the first inorganic encapsulation layer 310, the organic control layer 321, the organic encapsulation layer 330, and the second inorganic encapsulation layer 340 may correspond to a unit encapsulation part 300 configured to seal the display element 200 corresponding to the unit display PU (see FIG. 1).

Figure 1H:
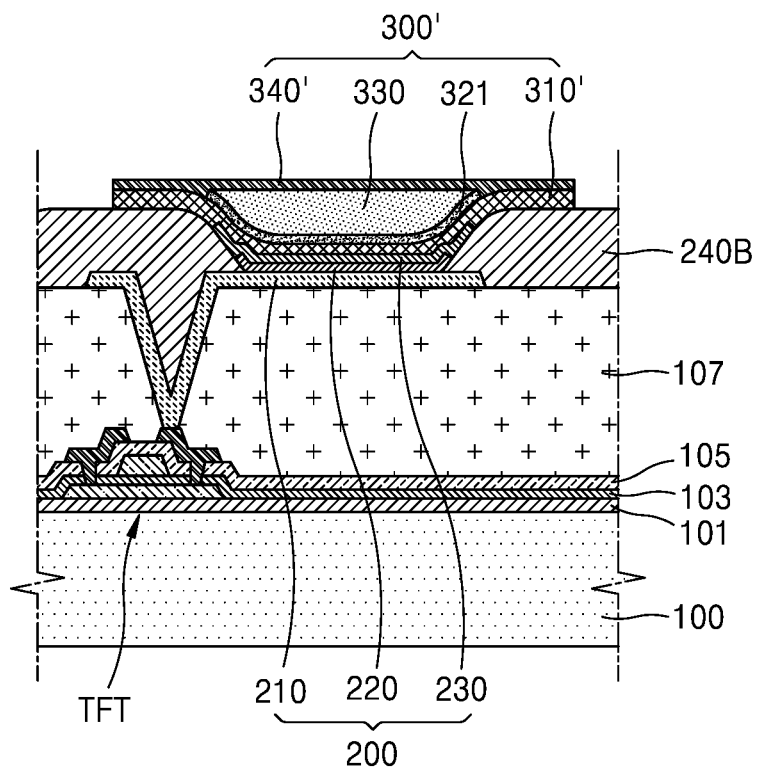

Referring to FIG. 1H, first and second inorganic encapsulation layers 310' and 340' may be patterned. A patterning process may include, for example, an etching process such as dry etching. The patterning may be performed to remove a region not overlapping the display element 200, for example, remove a portion adjoining an outer edge of the display element 200. A unit encapsulation part 300' including the patterned first and second inorganic encapsulation layers 310' and 340' may have an island shape corresponding to the display element 200 while overlapping the display element 200. A width of the first and second inorganic encapsulation layers 310' and 340' are greater than a width of the display element 200.

Though the above embodiment has described an operation of patterning the first and second inorganic encapsulation layers 310' and 340' with reference to FIG. 1H, the present disclosure is not limited thereto. A method of manufacturing a display device according to another embodiment may include operations described with reference to FIGS. 1A to 1G. That is, the unit display PU illustrated in FIG. 1A may be sealed by the unit encapsulation part 300 described with reference to FIG. 1G, or sealed by the unit encapsulation part 300' described with reference to FIG. 1H.

In the case where the opposite electrode 230 of the display element 200 is patterned to correspond to the unit display PU as in the embodiments of FIGS. 1A to 1G, or FIGS. 1A to 1H, the opposite electrode 230 may receive a preset voltage through a voltage line (not shown) electrically connected to the opposite electrode 230. However, the embodiment is not limited thereto. The opposite electrode 230 may be formed as one body to correspond to a plurality of display elements as described below with reference to FIGS. 2A and 2B.

Figure 2A:
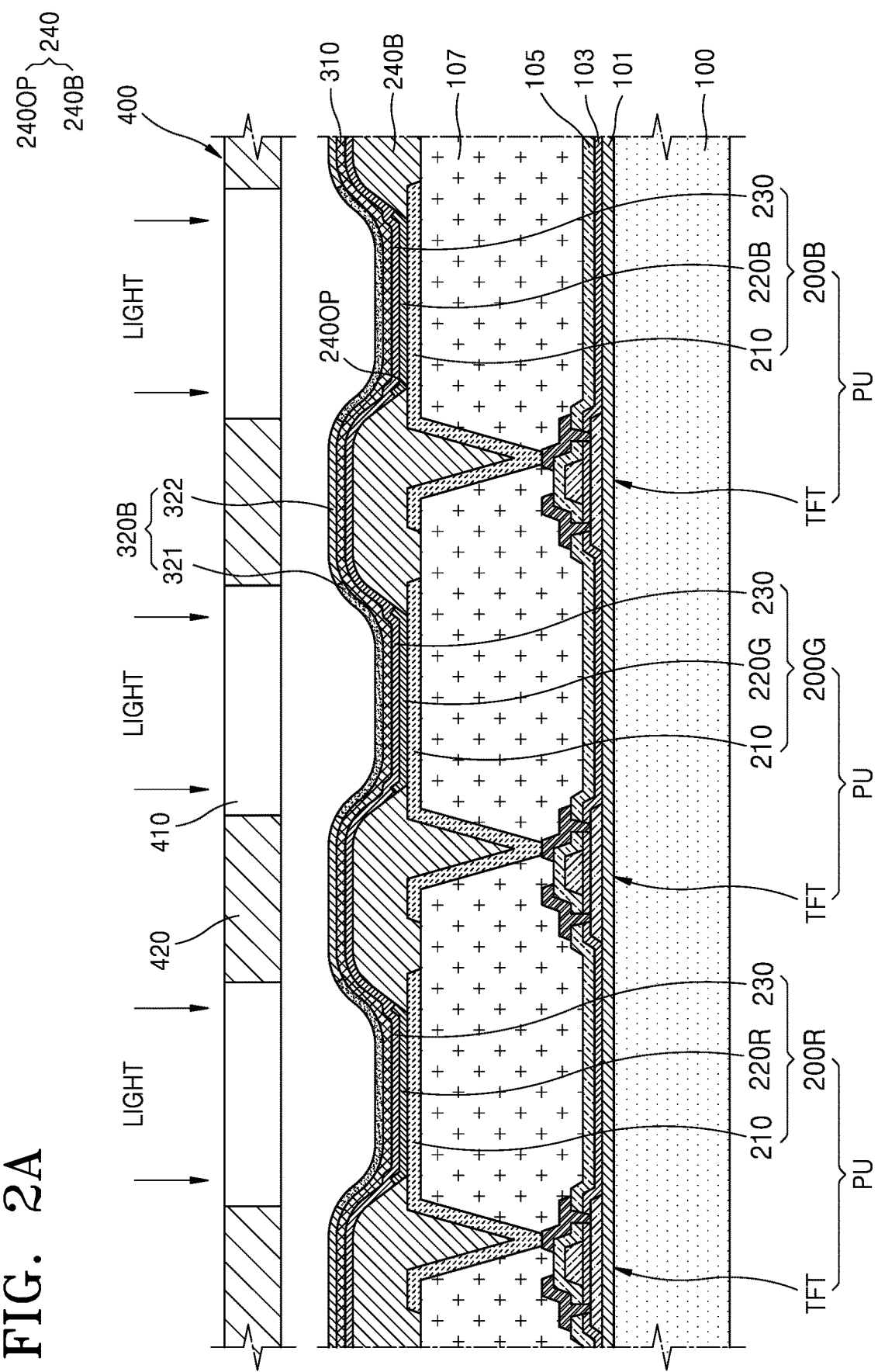
FIGS. 2A and 2B are cross-sectional views of some of processes of a method of manufacturing a display device according to another embodiment.
Figure 2B:
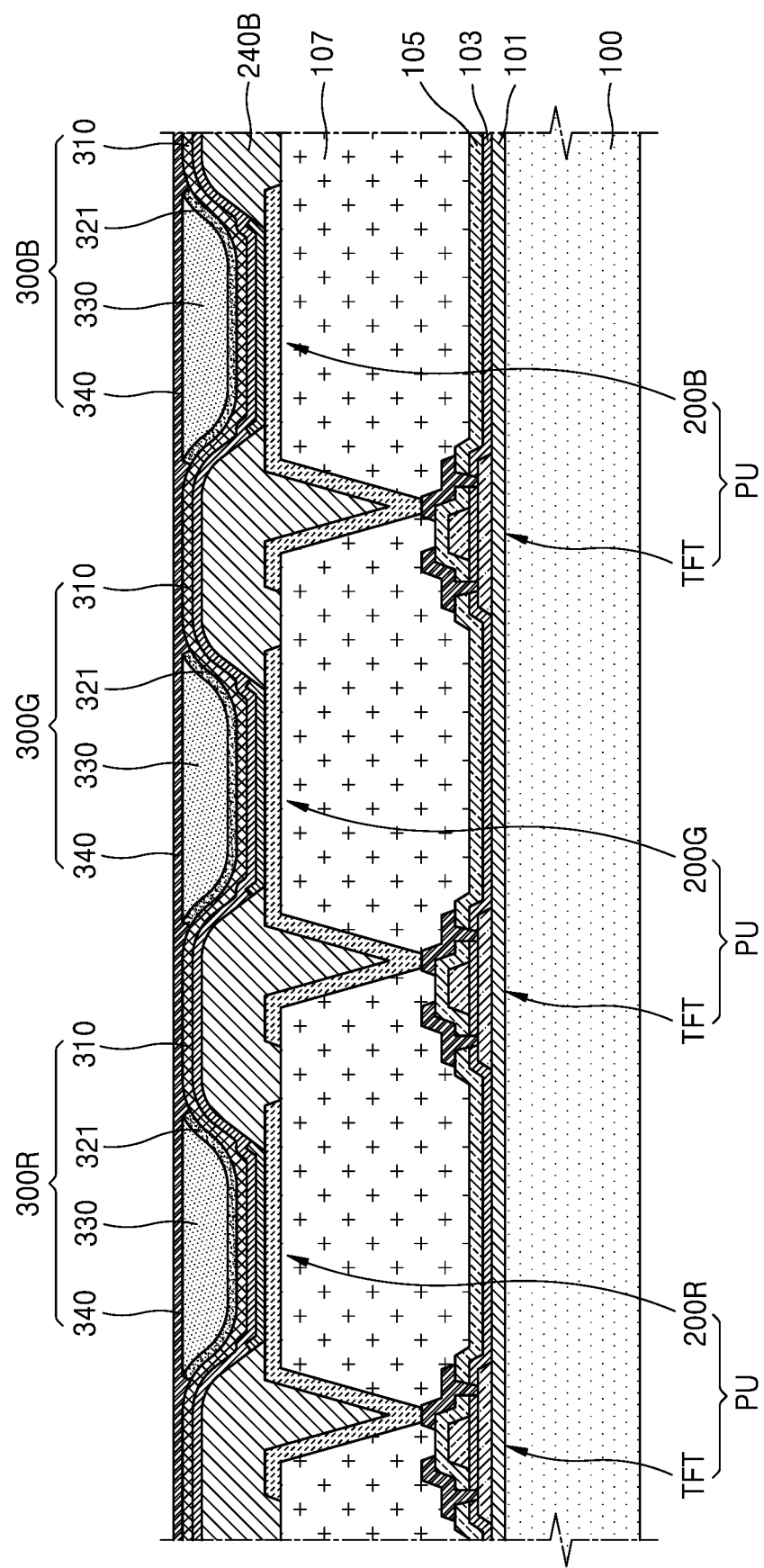

FIGS. 2A and 2B are cross-sectional views of some of processes of a method of manufacturing a display device according to another embodiment.

Referring to FIG. 2A, unit displays PU are formed over the substrate 100. As described with reference to FIG. 1A, one display element may correspond to one unit display PU. FIG. 2A illustrates a unit display PU including a display element 200R including an intermediate layer 220R configured to emit red light, a unit display PU including a display element 200G including an intermediate layer 220G configured to emit green light, and a unit display PU including a display element 200B including an intermediate layer 220B configured to emit blue light.

Each of the display elements 200R, 200G, and 200B may be formed through a process below. After the pixel electrodes 210 each having an island shape are formed, the pixel-defining layer 240 including the openings 240OP and the bank portion 240B is formed, and each of the intermediate layers 220R, 220G, and 220B is formed. The pixel electrodes 210 may be patterned simultaneously during the same process, and the intermediate layers 220R, 220G, and 220B may be individually formed during a separate process. After that, the opposite electrode 230 is formed. The opposite electrode 230 may be formed as one body to correspond to the display elements 200R, 200G, and 200B.

After the display elements 200R, 200G, and 200B are formed, the first inorganic encapsulation layer 310 is formed. The first inorganic encapsulation layer 310 may be formed as one body to correspond to the display elements 200R, 200G, and 200B. A material and a process of the first inorganic encapsulation layer 310 is the same as that described with reference to FIG. 1B.

After that, the organic material layer with light-tunable wettability is formed, and the organic control layer 320B including the first region 321 having hydrophilicity and the second region 322 having hydrophobicity is formed by irradiating preset light (e.g. a UV) with the mask 400. The light-transmissive portions 410 of the mask 400 may respectively correspond to the red, green, and blue display elements 200R, 200G, and 200B. A process of adjusting hydrophobicity and hydrophilicity of the organic control layer 320B by using light is the same as that described with reference to FIGS. 1C and 1D.

After that, the organic encapsulation layer 330 is formed as illustrated in FIG. 2B by controlling flowing of the monomer by using the first and second regions 321 and 322 of the organic control layer 320B. The organic encapsulation layer 330 may be formed in an island shape corresponding to each of the unit displays PU. After the organic encapsulation layer 330 is formed, the second region 322 (see FIG. 2A) is removed. A process of forming the organic encapsulation layer 330 and removing the second region 322 is the same as that described with reference to FIGS. 1E and 1F.

Next, the second inorganic encapsulation layer 340 is formed on the organic encapsulation layer 330. The second inorganic encapsulation layer 340 may be formed as one body to correspond to the plurality of unit displays PU. A material and a process of the second inorganic encapsulation layer 340 are the same as those described with reference to FIG. 1G.

The process described with reference to FIGS. 2A and 2B is substantially the same as the process according to the embodiment described with reference to FIGS. 1A to 1G except that the opposite electrode 230 is formed as one body to cover the plurality of display elements 200R, 200G, and 200B.

Stacked bodies including the first inorganic encapsulation layer 310, the organic control layer 321, the organic encapsulation layer 330, and the second inorganic encapsulation layer 340 overlapping the display elements 200R, 200G, and 200B respectively of the unit displays PU are unit encapsulation parts 300R, 300G, and 300B, and may respectively seal the display elements 200R, 200G, and 200B.

Though the embodiments with reference to FIGS. 1A to 2B have described a case where one display element 200, 200R, 200G, or 200B corresponds to one unit display PU, the present disclosure is not limited thereto. In another embodiment, as described below with reference to FIGS. 3A and 3B, one unit display PU may include the plurality of display elements 200R, 200G, and 200B configured to respectively emit red, green, and blue light. For example, the display elements 200R, 200G, and 200B respectively emitting red, green, and blue light may configure one unit display PU.

Figure 3A:
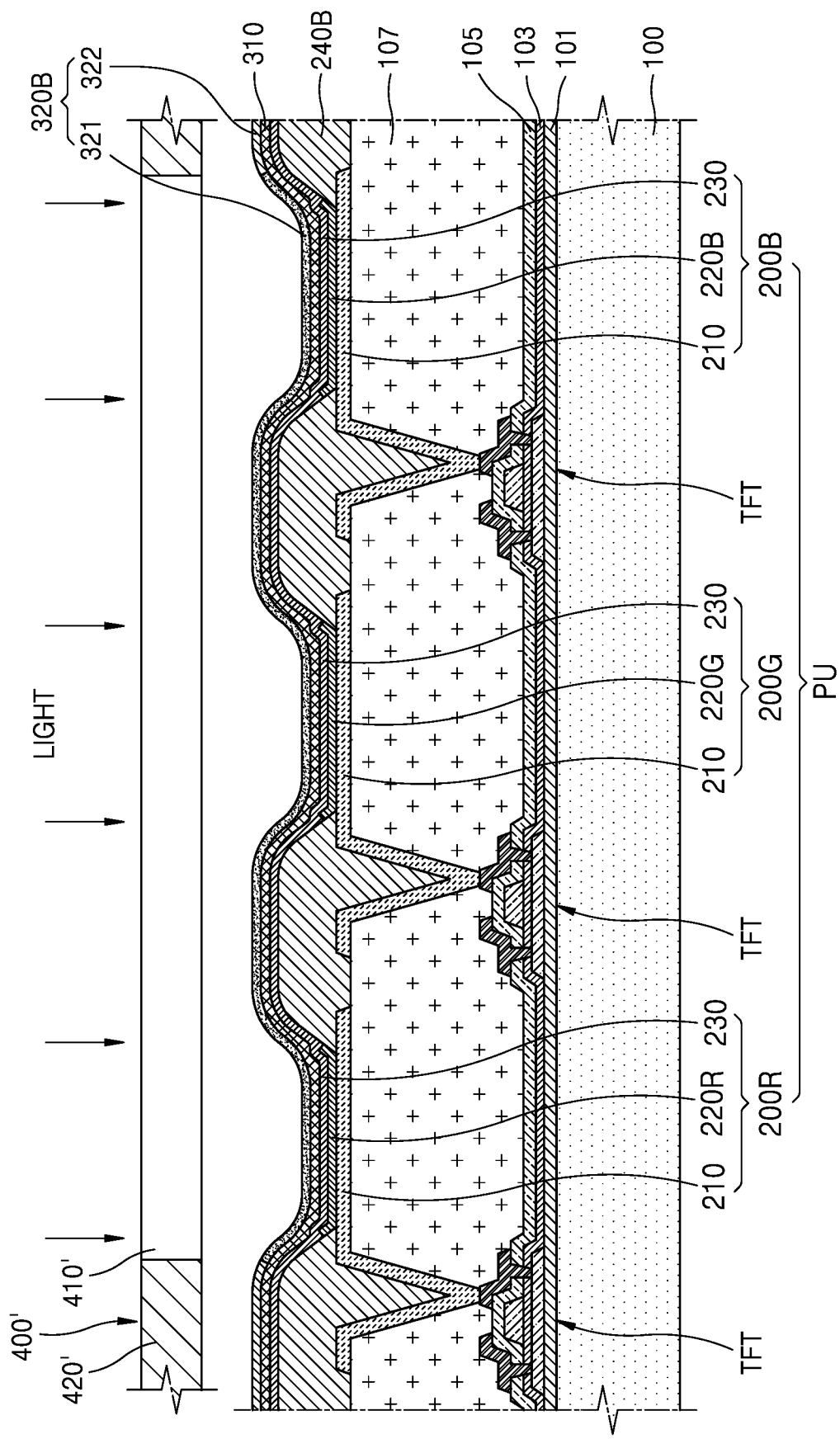
FIGS. 3A and 3B are cross-sectional views of some of processes of a method of manufacturing a display device according to another embodiment.
Figure 3B:
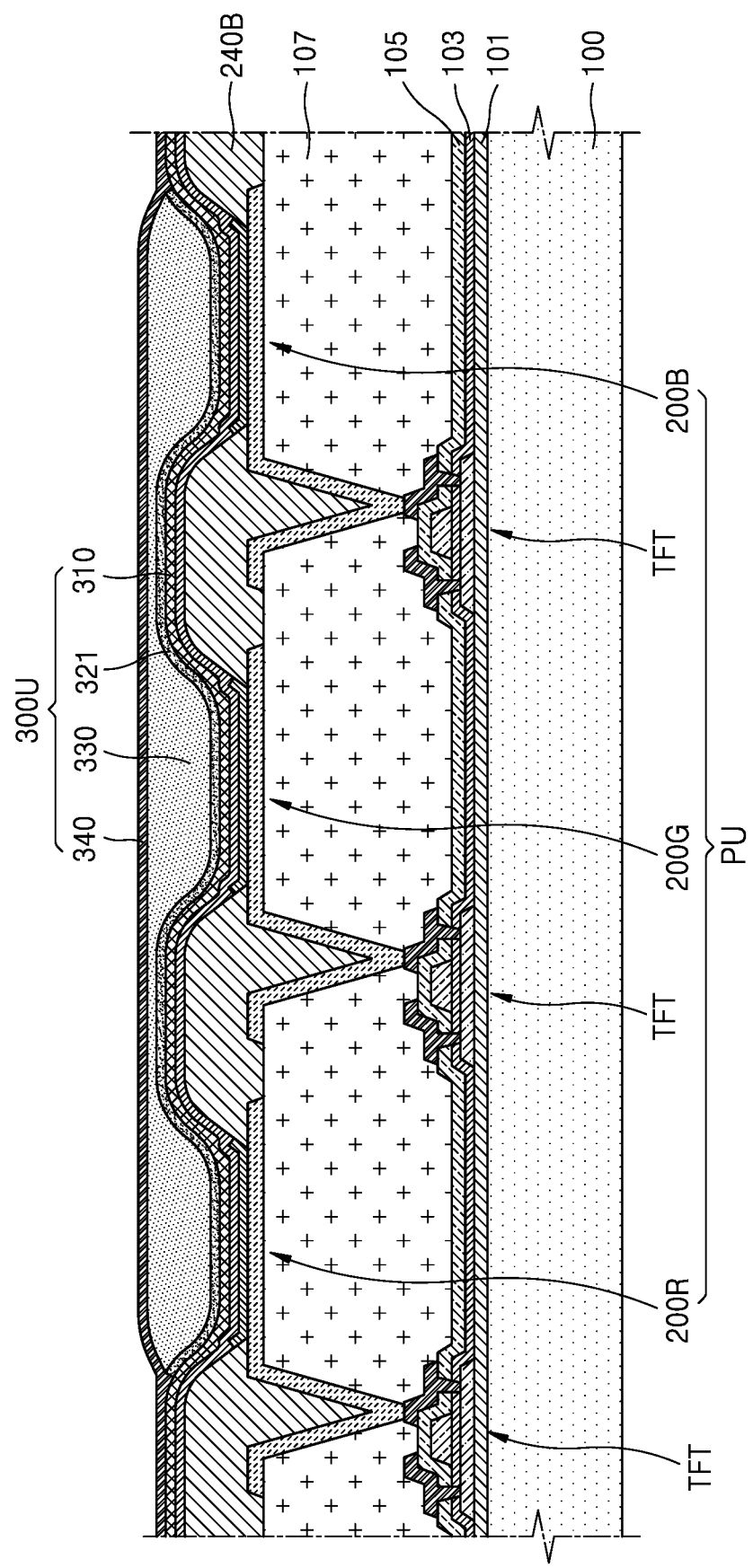

FIGS. 3A and 3B are cross-sectional views of some of processes of a method of manufacturing a display device according to another embodiment.

FIG. 3A illustrates that one unit display PU includes the display element 200R configured to emit red light, the display element 200G configured to emit green light, and the display element 200B configured to emit blue light. A process of forming display elements 200R, 200G, and 200B, and a process of forming the first inorganic encapsulation layer 310 on the display elements 200R, 200G, and 200B are the same as those described with reference to FIG. 2A.

After that, the organic material layer with light-tunable wettability is formed on the first inorganic encapsulation layer 310, and the organic control layer 320B including the first region 321 having hydrophilicity and the second region 322 having hydrophobicity is formed by irradiating preset light (e.g. a UV) with a mask 400'. The light-transmissive portion 410' of the mask 400' may be greater than the light-transmissive portion 410 of the mask 400 described with reference to FIG. 2A such that the light-transmissive portion 410' correspond to the red, green, and blue display elements 200R, 200G, and 200B. The first region 321 having hydrophilicity may be formed as one body to cover all of the red, green, and blue display elements 200R, 200G, and 200B. A process of adjusting hydrophilicity and hydrophobicity of the organic control layer 320B with light is the same as that described with reference to FIGS. 1C and 1D.

After that, the organic encapsulation layer 330 is formed as illustrated in FIG. 3B by controlling flowing of the monomer by using the first and second regions 321 and 322 of the organic control layer 320B. The organic encapsulation layer 330 is formed right on the first region 321 to cover all of the red, green, and blue display elements 200R, 200G, and 200B. After the organic encapsulation layer 330 is formed, the second region 322 (see FIG. 3A) is removed. A process of forming the organic encapsulation layer 330 and removing the second region 322 is the same as that described with reference to FIGS. 1E and 1F.

Next, the second inorganic encapsulation layer 340 is formed on the organic encapsulation layer 330. The second inorganic encapsulation layer 340 is formed as one body to cover all of the red, green, and blue display elements 200R, 200G, and 200B. A material and a process of the second inorganic encapsulation layer 340 are the same as those described with reference to FIG. 1G.

A stacked body including the first inorganic encapsulation layer 310, the organic control layer 321, the organic encapsulation layer 330, and the second inorganic encapsulation layer 340 overlapping the display elements 200R, 200G, and 200B of the unit display PU is a unit encapsulation part 300U, and may seal the display elements 200R, 200G, and 200B.

Though FIGS. 3A and 3B illustrate that each unit display PU includes the red, green, and blue display elements 200R, 200G, and 200B, the present disclosure is not limited thereto. In another embodiment, each unit display PU may include red, green, blue, and white display elements.

Figure 4:
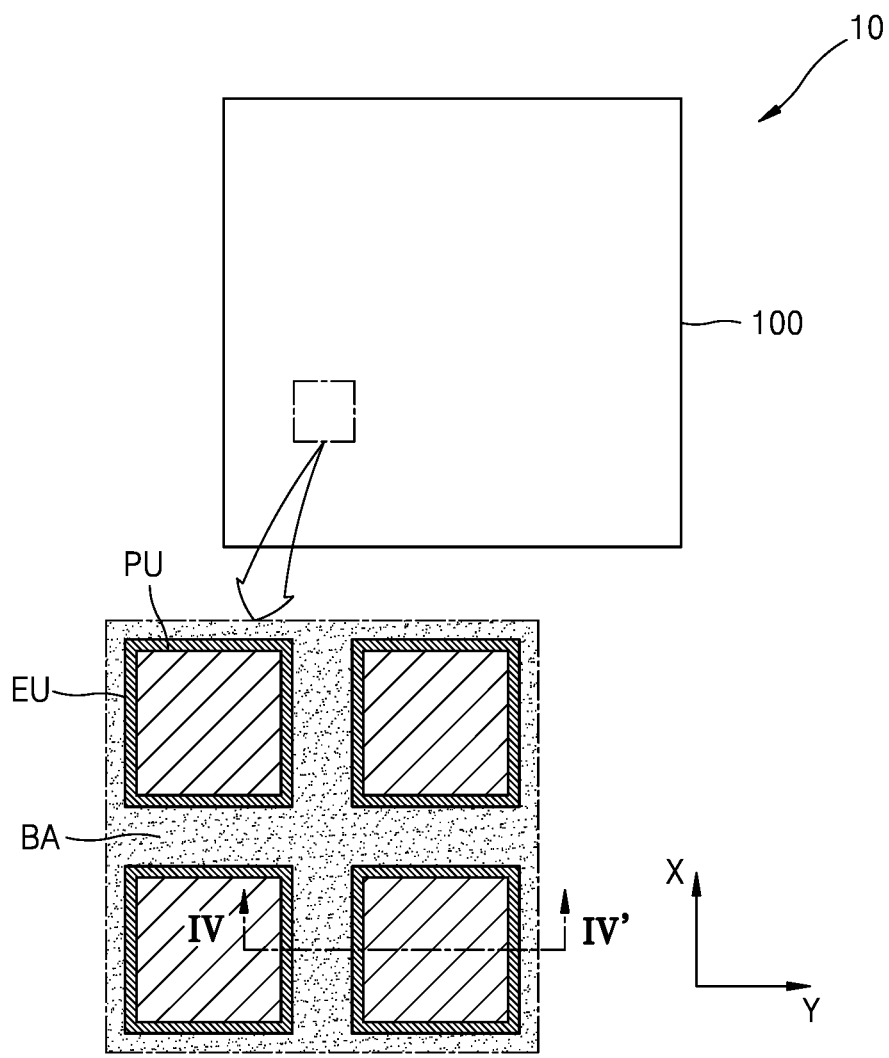
FIG. 4 is a plan view of a display device according to an embodiment.
Figure 5:
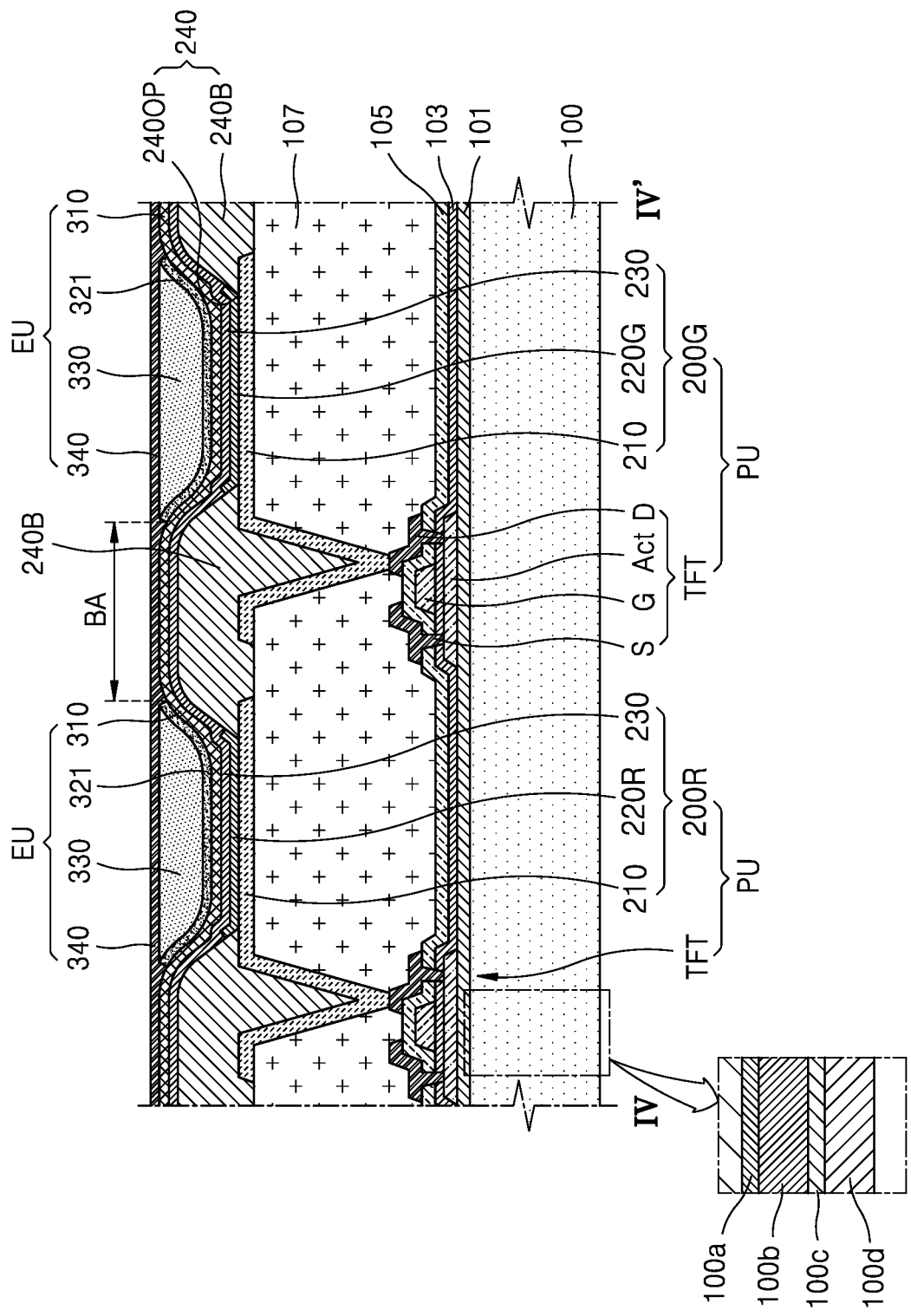
FIG. 5 is a cross-sectional view of the display device taken along line IV-IV' of FIG. 4 according to an embodiment.

FIG. 4 is a plan view of a display device according to an embodiment, and FIG. 5 is a cross-sectional view of the display device taken along line IV-IV' of FIG. 4 according to an embodiment.

Referring to FIGS. 4 and 5, a display device 10 may include a substrate 100, unit displays PU over the substrate 100, and unit encapsulation parts EU configured to respectively seal the unit displays PU. Since a size of each of the unit encapsulation parts EU is greater than a size of each of the unit displays PU, each unit encapsulation part EU may seal each unit display PU while covering each unit display PU.

The substrate 100 may include a flexible material which may be warped, bendable, foldable, rollable, or drawable. The substrate 100 may include various materials such as a metal material, or an organic material including a polymer such as PET, PEN, and PI.

In an embodiment, as illustrated in FIG. 5, the substrate 100 may include a multi-layer including a first barrier layer 100a, a first base layer 100b, a second barrier layer 100c, and a second base layer 100d sequentially stacked. In this case, the first barrier layer 100a may be most adjacent to a thin film transistor TFT formed over the substrate 100.

The first barrier layer 100a and the second barrier layer 100c may include an inorganic material. For example, the first barrier layer 100a and the second barrier layer 100c may include at least one of silicon nitride, aluminum nitride, zirconium nitride, titanium nitride, hafnium nitride, tantalum nitride, silicon oxide, aluminum oxide, titanium oxide, tin oxide, cesium oxide, and silicon oxynitride (SiON).

The first base layer 100b and the second base layer 100d may include an organic material. For example, the first base layer 100b and the second base layer 100d may include at least one of PI, PMMA, PC, PS, an acrylic-based resin, an epoxy-based resin, or polyethylene.

In an embodiment, each unit display PU may include a display element configured to emit light of a first color. The first color may be one of red, green, blue, and white. Hereinafter, for convenience of description, description is made with reference to FIG. 5 illustrating a cross-section of a display device corresponding to the red display element 200R and the green display element 200G.

The red display element 200R and the green display element 200G include the pixel electrodes 210, the opposite electrode 230, and the intermediate layers 200R and 220G disposed therebetween, each of the intermediate layer 200R and 220G including the organic emission layer.

The display element 200 is electrically connected to the thin film transistor TFT. The thin film transistor TFT may be a driving thin film transistor TFT, and may include a semiconductor layer Act, a gate electrode G overlapping a channel region of the semiconductor layer Act, a source electrode S, and a drain electrode D. The buffer layer 101 is disposed between the substrate 100 and the semiconductor layer Act. The gate insulating layer 103 is disposed between the semiconductor layer Act and the gate electrode G. The interlayer insulating layer 105 is disposed between the gate electrode G and the source electrode S and the drain electrode D. The buffer layer 101, the gate insulating layer 103, and the interlayer insulating layer 105 may be inorganic insulating layers. For example, the buffer layer 101, the gate insulating layer 103, and the interlayer insulating layer 105 may include a single layer or a multi-layer including silicon nitride, silicon oxide, and silicon oxynitride.

Though FIG. 5 illustrates that the thin film transistor TFT is a top-gate type thin film transistor, the present disclosure is not limited thereto. In another embodiment, the thin film transistor TFT may be a bottom-gate type thin film transistor in which a gate electrode is disposed below a semiconductor layer.

The thin film transistors TFT may be covered by the organic insulating layer 107, which is a planarization layer, and respectively electrically connected to the display elements 200R and 200G through contact holes of the organic insulating layers 107. A material of the organic insulating layer 107 may configure a single layer or a multi-layer including an organic material. The organic material may include at least one of a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

Each unit encapsulation part EU includes a stacked body including the first inorganic encapsulation layer 310, the organic control layer 321, the organic encapsulation layer 330, and the second inorganic encapsulation layer 340. Materials thereof are the same as those described above. The organic control layer 321 and the organic encapsulation layer 330 of each unit encapsulation part EU may be disposed in an island type corresponding to the unit display PU covered by each unit encapsulation part EU, but the first and second inorganic encapsulation layers 310 and 340 may be respectively connected, as one body, to other first and second inorganic encapsulation layers 310 and 340 of an adjacent unit encapsulation part EU. For example, as illustrated in FIG. 5, the organic control layer 321 and the organic encapsulation layer 330 of each unit encapsulation part EU may be disposed in an island type corresponding to one display element 200R or 200G of each unit display PU. That is, the organic control layer 321 and the organic encapsulation layer 330 are respectively separated from an adjacent organic control layer 321 and organic encapsulation layer 330 in a separation area BA between adjacent unit displays PU, but each of the first and second inorganic encapsulation layers 310 and 340 may be connected as one body to cover the adjacent display elements 200R and 200G in the separation area BA.

A level of the organic control layer 321 of each unit encapsulation part EU, that is, a vertical distance from the substrate 100 to a top surface of the organic control layer 312 may change variously for each region depending on elements disposed below the organic control layer 321. In contrast, a level of the organic encapsulation layer 330, that is, a vertical distance from the substrate 100 to a top surface of the organic encapsulation layer 330 may be relatively constant regardless of the elements below the organic encapsulation layer 330, that is, regardless of regions.

For example, a level of a region of the organic control layer 312 corresponding to the opening 240OP of the pixel-defining layer 240 is less than, that is, different from a level of a region of the organic control layer 312 corresponding to the bank portion 240B of the pixel-defining layer 240. In contrast, a level of a region of the organic encapsulation layer 330 corresponding to the opening 240OP of the pixel-defining layer 240, and a level of a region of the organic encapsulation layer 330 corresponding to the bank portion 240B of the pixel-defining layer 240 may have a relatively constant value, and thus a top surface of the region of the organic encapsulation layer 330 corresponding to the opening 240OP of the pixel-defining layer 240 and a top surface of a region of the organic encapsulation layer 330 corresponding to a sloped surface of the bank portion 240B of the pixel-defining layer 240 adjacent to the opening 240OP may have a relatively flat surface. Here, the relatively constant value may mean that a difference thereof is less than 10% of a maximum value.

Though FIG. 5 illustrates a case where each unit display PU is a sub-pixel, that is, includes one display element 200, the present disclosure is not limited thereto. In another embodiment, each unit display PU may correspond to a group of sub-pixels each emitting light of a different color as described below with reference to FIG. 6.

Figure 6:
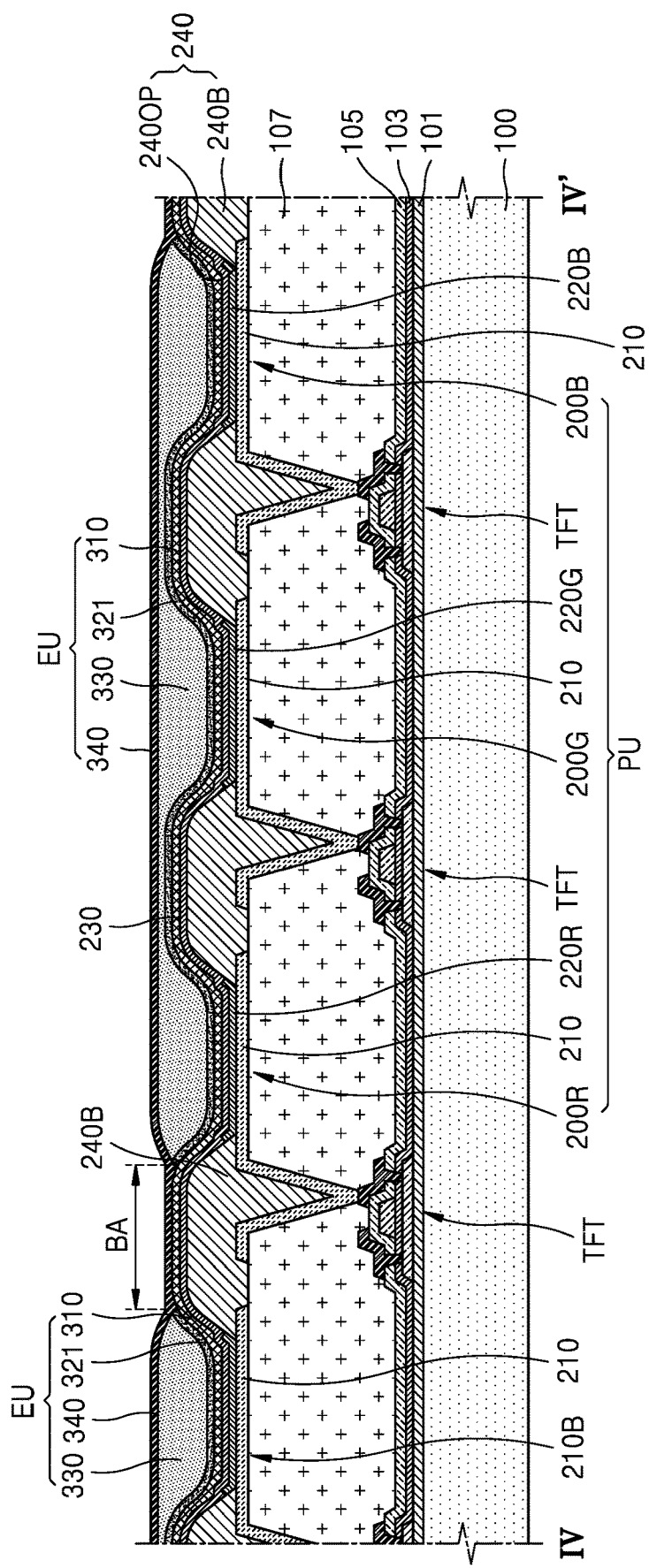
FIG. 6 is a cross-sectional view of the display device taken along line IV-IV' of FIG. 4 according to another embodiment.

FIG. 6 is a cross-sectional view of the display device taken along line IV-IV' of FIG. 4 according to another embodiment.

Referring to FIG. 6, each unit display PU may include the display elements 200R, 200G, and 200B configured to respectively emit red, green, and blue light. Though FIG. 6 illustrates the unit display PU includes three display elements, the unit display PU may include four display elements configured to emit red, green, blue, and white light according to another embodiment.

Each unit encapsulation layer EU includes the first inorganic encapsulation layer 310, the organic control layer 321, the organic encapsulation layer 330, and the second inorganic encapsulation layer 340. Materials thereof are the same as those described above. The organic control layer 321 and the organic encapsulation layer 330 of each unit encapsulation part EU may be disposed in an island type corresponding to the unit display PU covered by each unit encapsulation part EU, but the first and second inorganic encapsulation layers 310 and 340 may be respectively connected, as one body, to other first and second inorganic encapsulation layers 310 and 340 of an adjacent unit encapsulation part EU. For example, as illustrated in FIG. 6, the organic control layer 321 and the organic encapsulation layer 330 of each unit encapsulation part EU may be disposed in an island type corresponding to the display elements 200R, 200G, and 200B of each unit display PU. That is, the organic control layer 321 and the organic encapsulation layer 330 are respectively separated from an adjacent organic control layer 321 and organic encapsulation layer 330 in a separation area BA between adjacent unit displays PU, but each of the first and second inorganic encapsulation layers 310 and 340 may be connected as one body to cover the adjacent display elements 200 in the separation area BA.

As illustrated in FIGS. 5 and 6, the first and second inorganic encapsulation layers 310 and 340 of each unit encapsulation part EU may contact each other over the bank portion 240B between adjacent unit displays PU.

Figure 7:
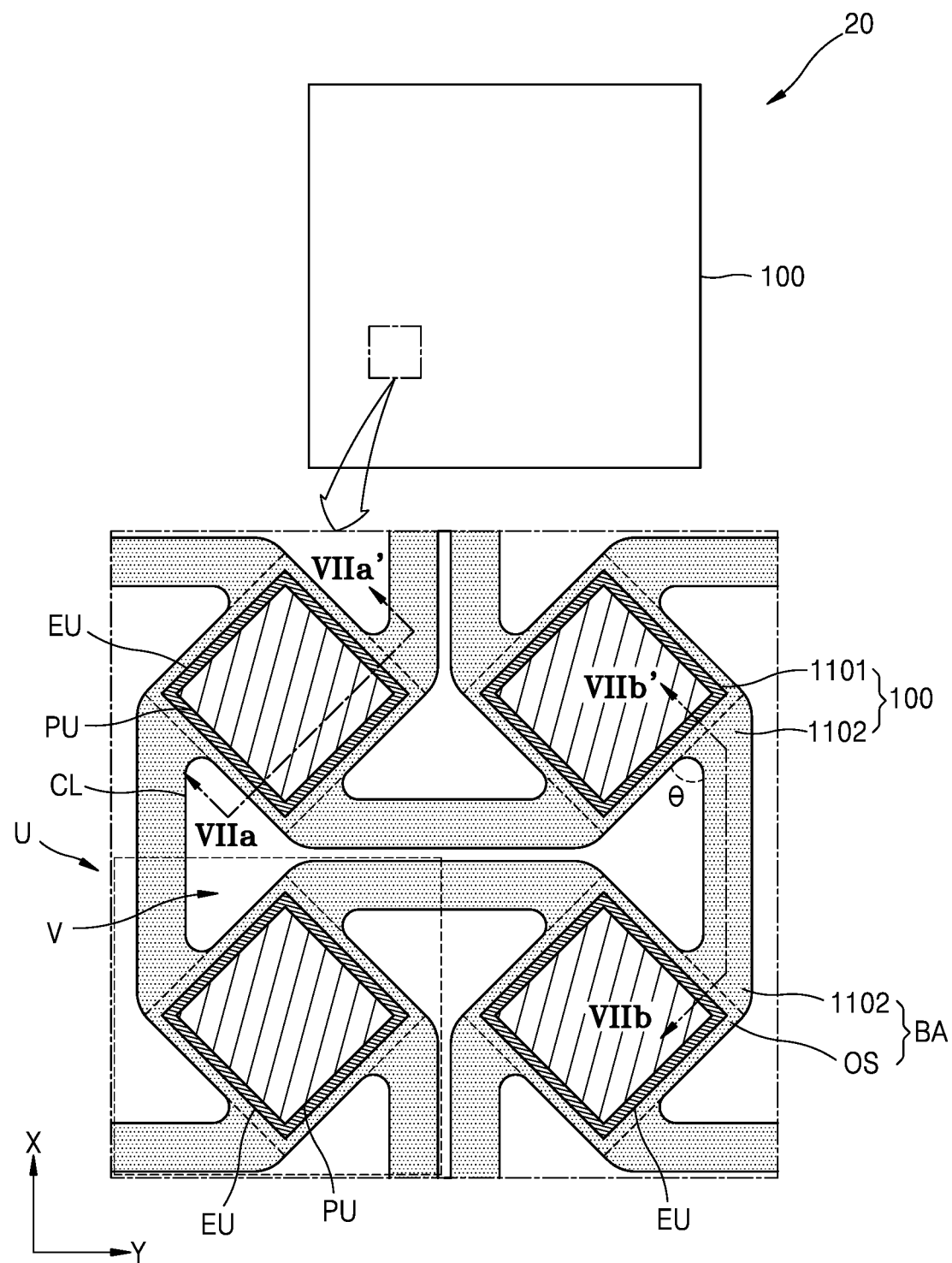
FIG. 7 is a plan view of a display device according to another embodiment.
Figure 8:
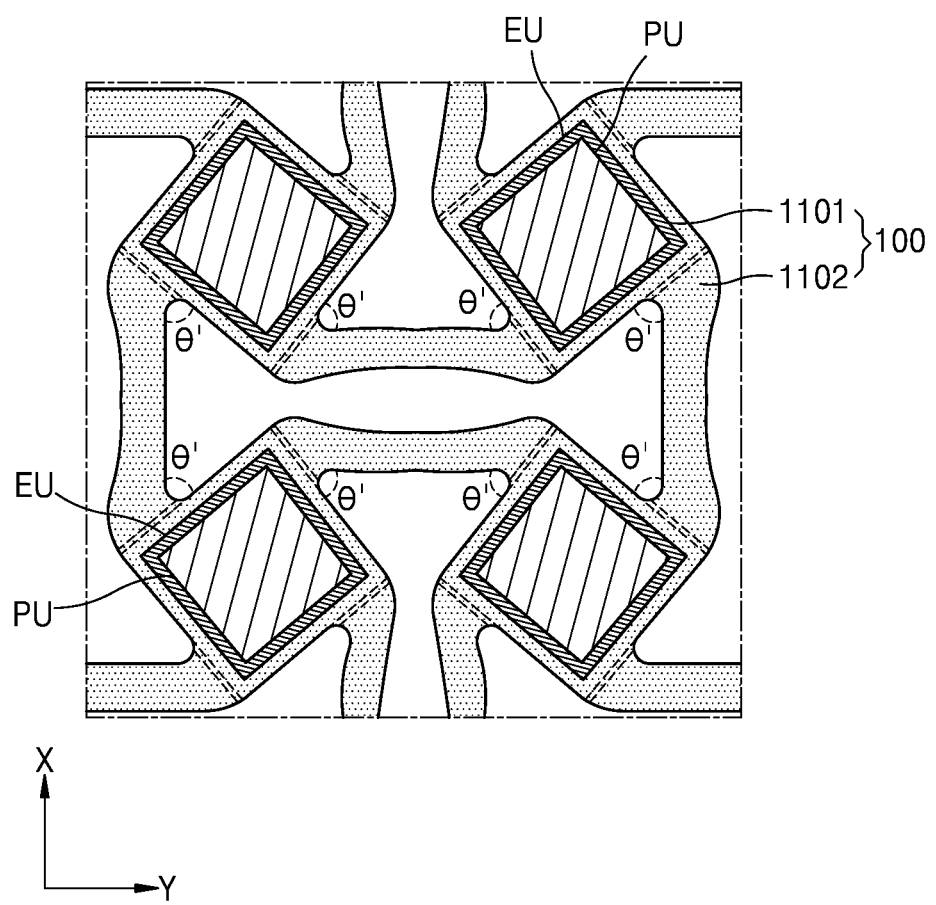
FIG. 8 is a plan view illustrating that a shape of the display device of FIG. 7 has changed.
Figure 9:
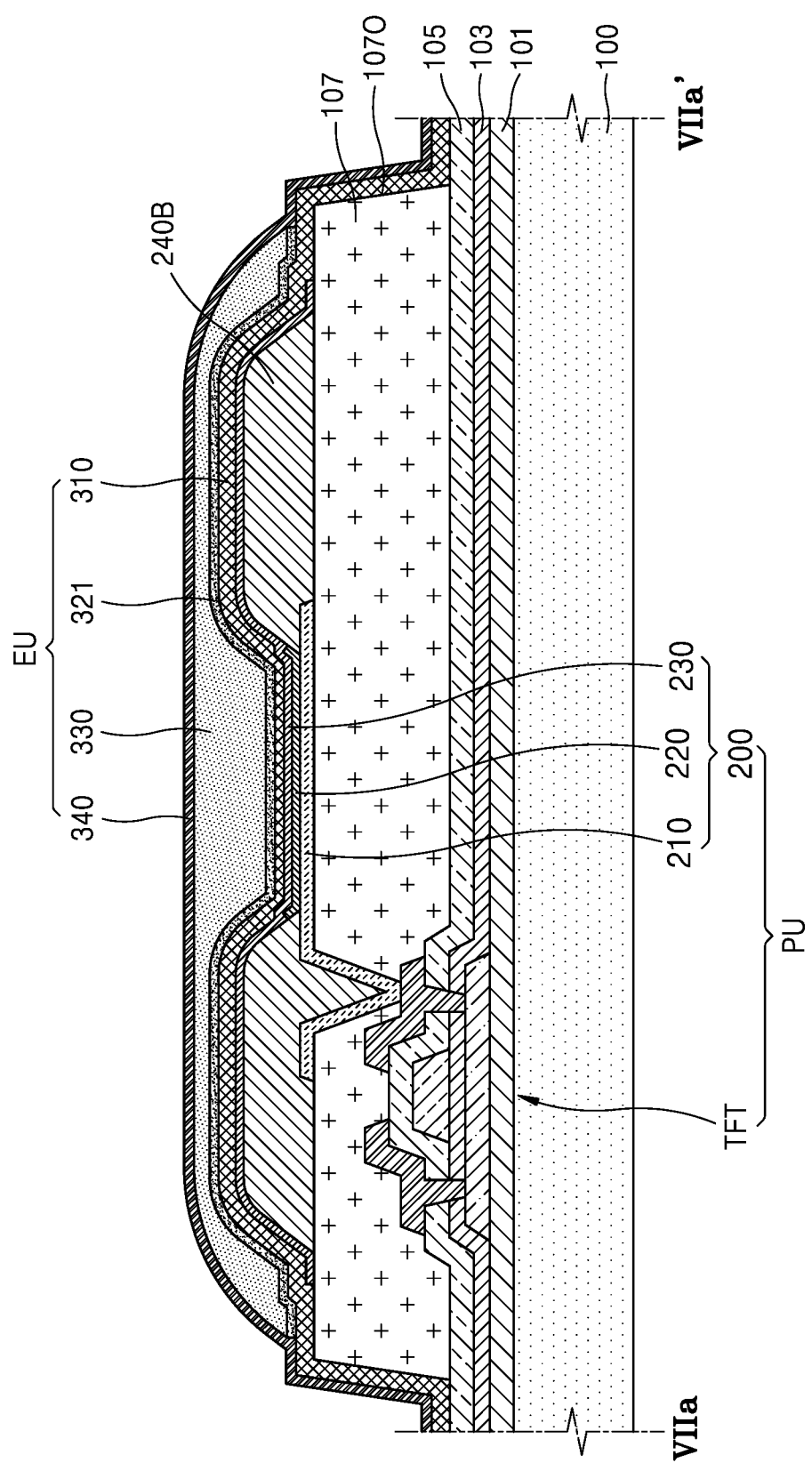
FIG. 9 is a cross-sectional view of the display device taken along line VIIa-VIIa' of FIG. 7 according to an embodiment.
Figure 10:
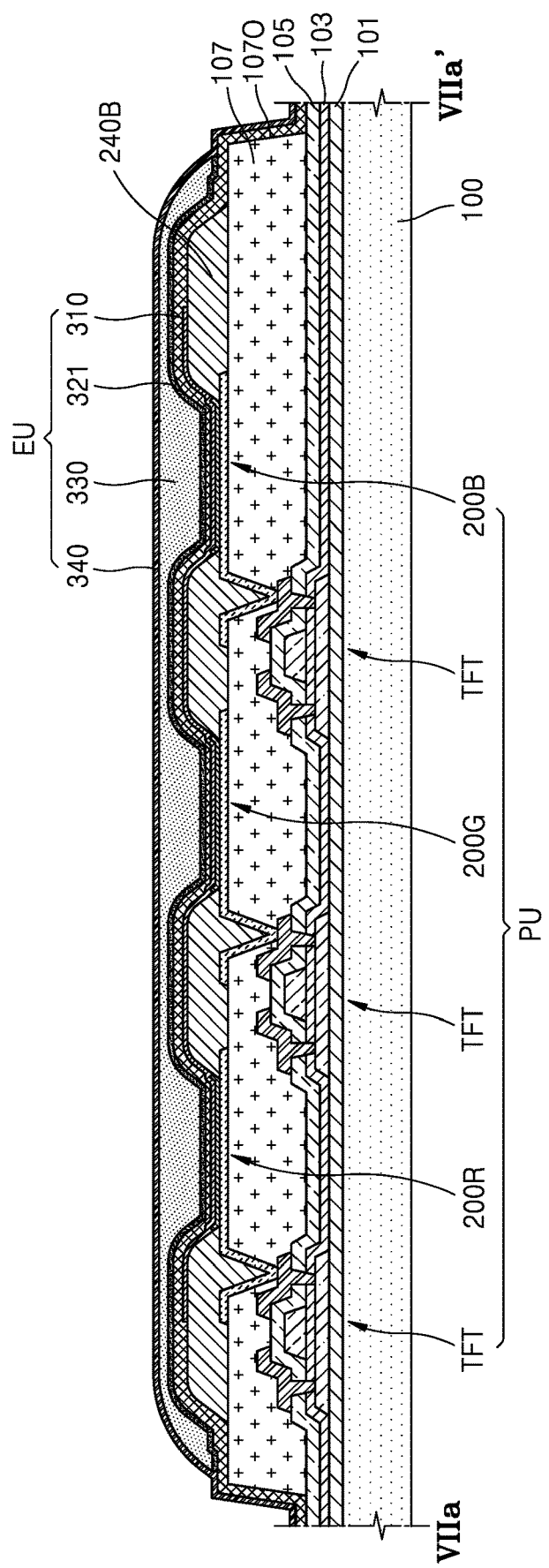
FIG. 10 is a cross-sectional view of the display device taken along line VIIa-VIIa' of FIG. 7 according to another embodiment.

FIG. 7 is a plan view of a display device 20 according to another embodiment, FIG. 8 is a plan view illustrating that a shape of the display device 20 of FIG. 7 has changed, FIG. 9 is a cross-sectional view of the display device 20 taken along line VIIa-VIIa' of FIG. 7 according to an embodiment, and FIG. 10 is a cross-sectional view of the display device 20 taken along line VIIa-VIIa' of FIG. 7 according to another embodiment.

Referring to FIG. 7, the display device 20 may include the substrate 100, unit displays PU over the substrate 100, and unit encapsulation parts EU respectively sealing the unit displays PU. A size of each unit encapsulation part EU is greater than a size of each unit display PU and thus each unit encapsulation part EU may seal each unit display PU while covering each unit display PU.

The substrate 100 may include a plurality of islands 1101, a plurality of connectors 1102 connecting the plurality of islands 1101, and a plurality of through portions (hereinafter, through holes) V passing through the substrate 100, the plurality of through holes V being between the plurality of connectors 1102.

The islands 1101 may be spaced apart from each other. For example, the islands 1101 may be repeatedly disposed in an X direction (a first direction) and a Y direction (a second direction) to configure a plane lattice pattern. For example, the X direction (the first direction) and the Y direction (the second direction) may be directions crossing each other to form a right angle, an obtuse angle, or an acute angle.

The connectors 1102 may connect the islands 1101. Specifically, four connectors 1102 may be connected to each of the islands 1101. The four connectors 1102 connected to one island 1101 may respectively extend in different directions, and may be respectively connected to four other islands 1101 adjacent to the one island 1101. The islands 1101 and the connectors 1102 may include the same material and may be formed as one body.

The through holes V pass through the substrate 100 in a thickness direction of the substrate 100. The through holes V may be defined as regions surrounded by a closed curve CL when viewed from a plane of FIG. 7. The through portion V may reduce weight of the substrate 100 and improve flexibility of the substrate 100. Also, since shapes of the through holes V are changed when warping, bending, rolling, etc. occurs in the substrate 100, the through holes V may prevent abnormal transformation of the substrate 100 and improve durability of the substrate 100 by effectively reducing the occurrence of stress while the substrate 100 is transformed. The through holes V may be adjacent to adjacent four islands 1101.

The through holes V may be formed by removing selective portions of the substrate 100 based on a method such as etching, etc. In another embodiment, the substrate 100 may be formed to include the through holes V while the substrate 100 is manufactured. In another embodiment, after the plurality of displays PU are formed on the substrate 100, the through holes V may be formed by patterning the substrate 100. The through holes V may be formed in the substrate 100 in various ways, and a method of forming the through holes V may not be limited to the examples described herein.

The unit display PU and the unit encapsulation part EU sealing the unit display PU are disposed on the island 1101 of the substrate 100 having the above structure. The island 1101, the unit display PU, the unit encapsulation part EU of the substrate 100 configure one unit pattern U, and may be repeatedly disposed as illustrated in FIG. 7. That is, the display device 20 may be understood as the unit patterns U repeatedly disposed in the X direction and the Y direction, the unit patterns U coupling to each other. For example, adjacent unit patterns U may be disposed such that the adjacent unit patterns U are symmetric with respect to an axis along the X direction and/or the Y direction.

An angle θ formed by an extension direction of the connector 1102 and one side of the island 1101 connected to the connector 1102 may be an acute angle. Therefore, since the islands 1101 and the unit displays PU on the islands 1101 are densely disposed, a length of the connector 1102 may be minimized, and an elongation characteristic of the substrate 100 may be improved. For example, as illustrated in FIG. 8, while the display device 20 is stretched in the X direction or the Y direction, an angle formed by one side of the connector 102 and one side of the island 1101 may increase (θ'>θ), and thus an area of the through portion V may increase, and a distance between adjacent unit displays PU may be changed.

The unit displays PU are respectively disposed on the islands 1101 and respectively covered by the unit encapsulation parts EU. A size of each unit encapsulation part EU is greater than a size of each unit display PU and thus, the unit encapsulation part EU covers the unit display PU. FIG. 7 illustrates the separation area BA which is an area between adjacent unit displays PU. The separation area BA may correspond to an edge OS of the connector 1102 and the island 1101.

The unit display PU includes at least one display element. In an embodiment, as illustrated in FIG. 9, the unit display PU includes the display element 200. The display element 200 includes the pixel electrode 210, the intermediate layer 220 including an emission layer, and the opposite electrode 230, the emission layer emitting light of a first color. The display element 200 is electrically connected to a thin film transistor TFT. The first color may be one of red, green, blue, and white. In this case, the unit display PU of FIG. 9 corresponds to a sub-pixel configured to emit light of the first color. In another embodiment, as illustrated in FIG. 10, the unit display PU includes the display elements 200R, 200G, and 200B configured to emit light of different colors. FIG. 10 illustrates that one unit display PU includes the display elements 200R, 200G, and 200B configured to respectively emit red, green, and blue light. In this case, the unit display PU corresponds to a unit pixel. Though FIG. 10 illustrates that the unit display PU includes the red, green, and blue display elements 200R, 200G, and 200B, the present disclosure is not limited thereto. In another embodiment, the unit display PU may include four display elements configured to respectively emit red, green, blue, and white light.

The unit display PU illustrated in FIGS. 9 and 10 is protected by the unit encapsulation part EU. The unit encapsulation part EU includes at least one inorganic encapsulation layer and at least one organic encapsulation layer. For example, the unit encapsulation part EU may include the first inorganic encapsulation layer 310, the second inorganic encapsulation layer 340, the organic encapsulation layer 330 disposed therebetween, and the organic control layer 321 disposed right under the organic encapsulation layer 330. Since materials of the first inorganic encapsulation layer 310, the organic control layer 321, the organic encapsulation layer 330, and the second inorganic encapsulation layer 340 are the same as those described above, repeated description thereof is omitted.

An insulating layer under the display elements 200, 200R, 200G, and 200B respectively of the unit displays PU described with reference to FIGS. 9 and 10, for example, the organic insulating layer 107 may be patterned. During a process of forming the organic insulating layer 107 or a process thereafter, a portion 1070 (referred to as a through portion) of the organic insulating layer 107 may be removed. An inorganic insulating layer under the organic insulating layer 107, for example, the interlayer insulating layer 105 may be exposed through the through portion 1070 of the organic insulating layer 107. When viewed in a plan view, the through portion 1070 of the organic insulating layer 107 may have a shape of a similar figure to that of the through portion V described with reference to FIG. 7. In other words, the organic insulating layer 107 may be understood as being disposed on the island 1101 (see FIG. 7) of the substrate 100.

The organic control layer 321 and the organic encapsulation layer 330 of the unit encapsulation part EU may be disposed over the organic insulating layer 107 to correspond to each unit display PU. The first and second inorganic encapsulation layers 310 and 340 may directly contact an inorganic insulating layer, for example, the interlayer insulating layer 105 through the through portion 1070 of the organic insulating layer 107. For example, the first and second inorganic encapsulation layers 310 and 340, and the interlayer insulating layer 105 may contact each other.

Each of the unit encapsulation parts EU described with reference to FIGS. 7, 9, and 10 overlaps each of the unit displays PU to cover each of the unit displays PU. The first and second inorganic encapsulation layers 310 and 340 of the unit encapsulation parts EU may be connected to each other or separated from each other in the separation area BA between adjacent unit displays PU as described below.

Figure 11:
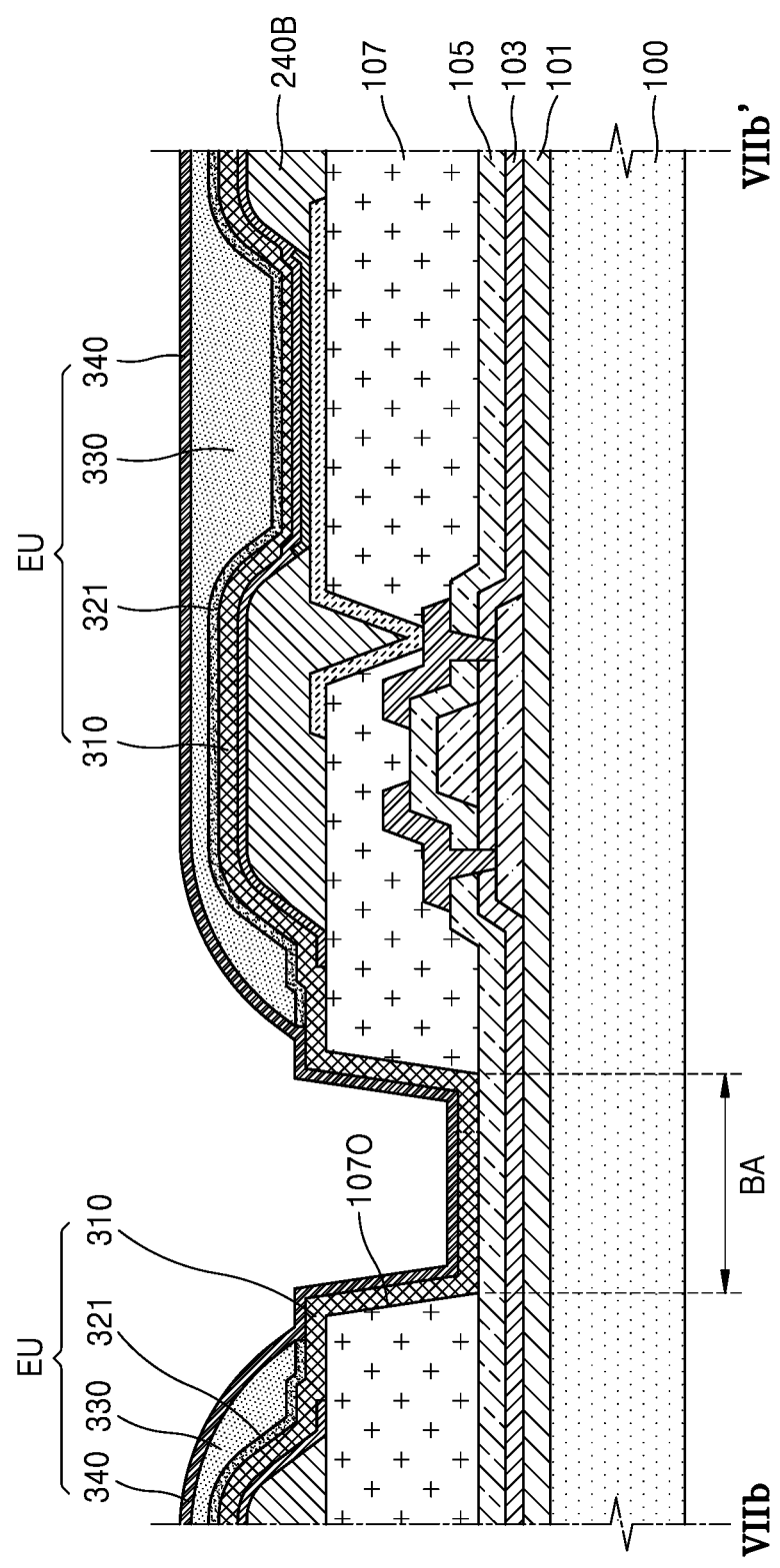
FIG. 11 is a cross-sectional view of the display device taken along line VIIb-VIIb' of FIG. 7 according to an embodiment.
Figure 12:
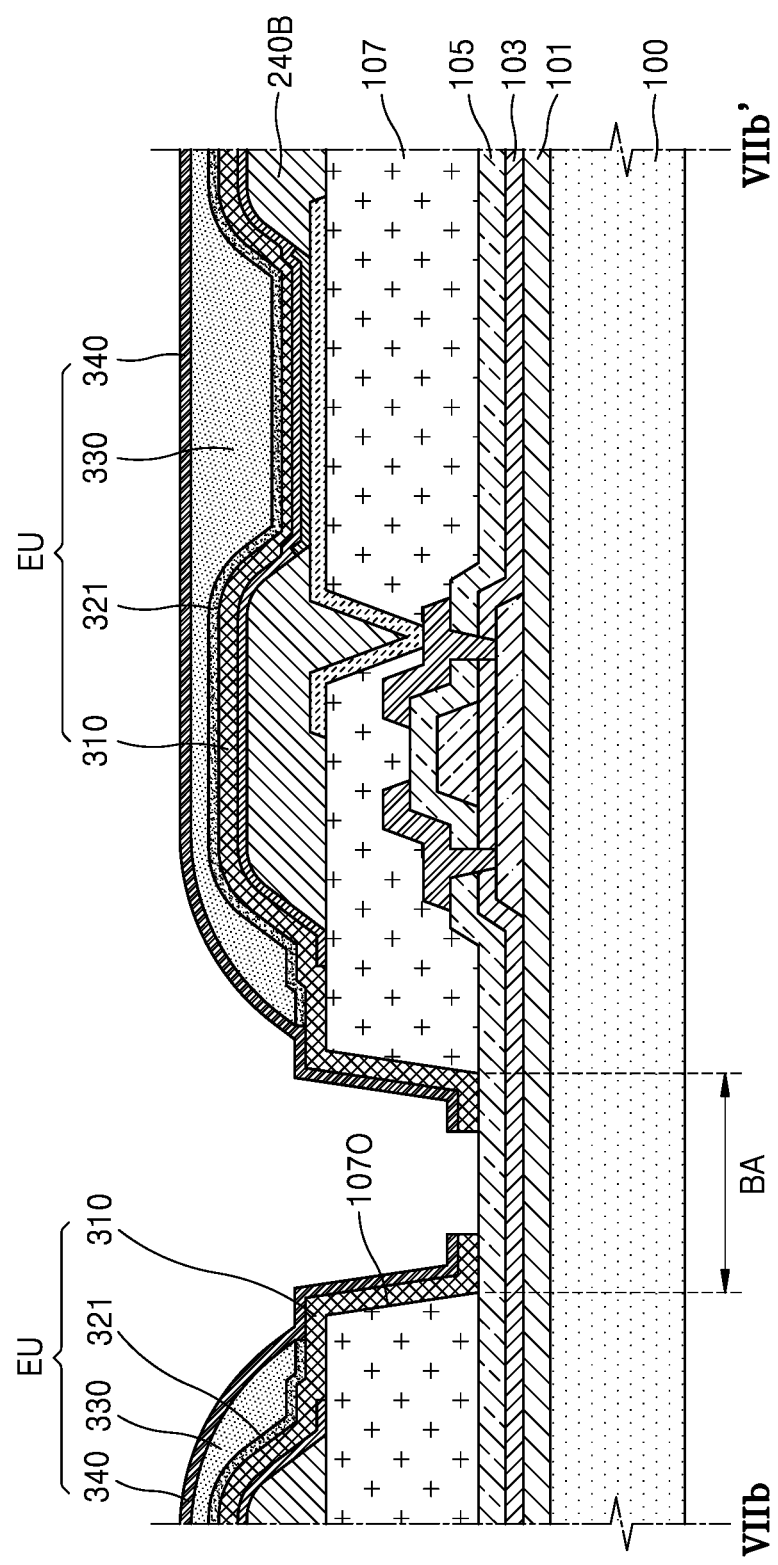
FIG. 12 is a cross-sectional view of the display device taken along line VIIb-VIIb' of FIG. 7 according to another embodiment.

FIG. 11 is a cross-sectional view of the display device taken along line VIIb-VIIb' of FIG. 7 according to an embodiment, and FIG. 12 is a cross-sectional view of the display device taken along line VIIb-VIIb' of FIG. 7 according to another embodiment.

Referring to FIGS. 11 and 12, the organic control layers 321 and the organic encapsulation layers 330 of adjacent unit encapsulation parts EU are disposed in island shapes respectively corresponding to the unit displays PU. The first and second inorganic encapsulation layers 310 and 340 of the adjacent unit encapsulation parts EU may be connected to each other (see FIG. 11) or separated and spaced apart from each other in the separation area BA (see FIG. 12). In the separation area BA, the first inorganic encapsulation layer 310 may contact the interlayer insulating layer 105, which is an inorganic insulating layer, through the through portion 1070 of the organic insulating layer 107.

Figure 13:
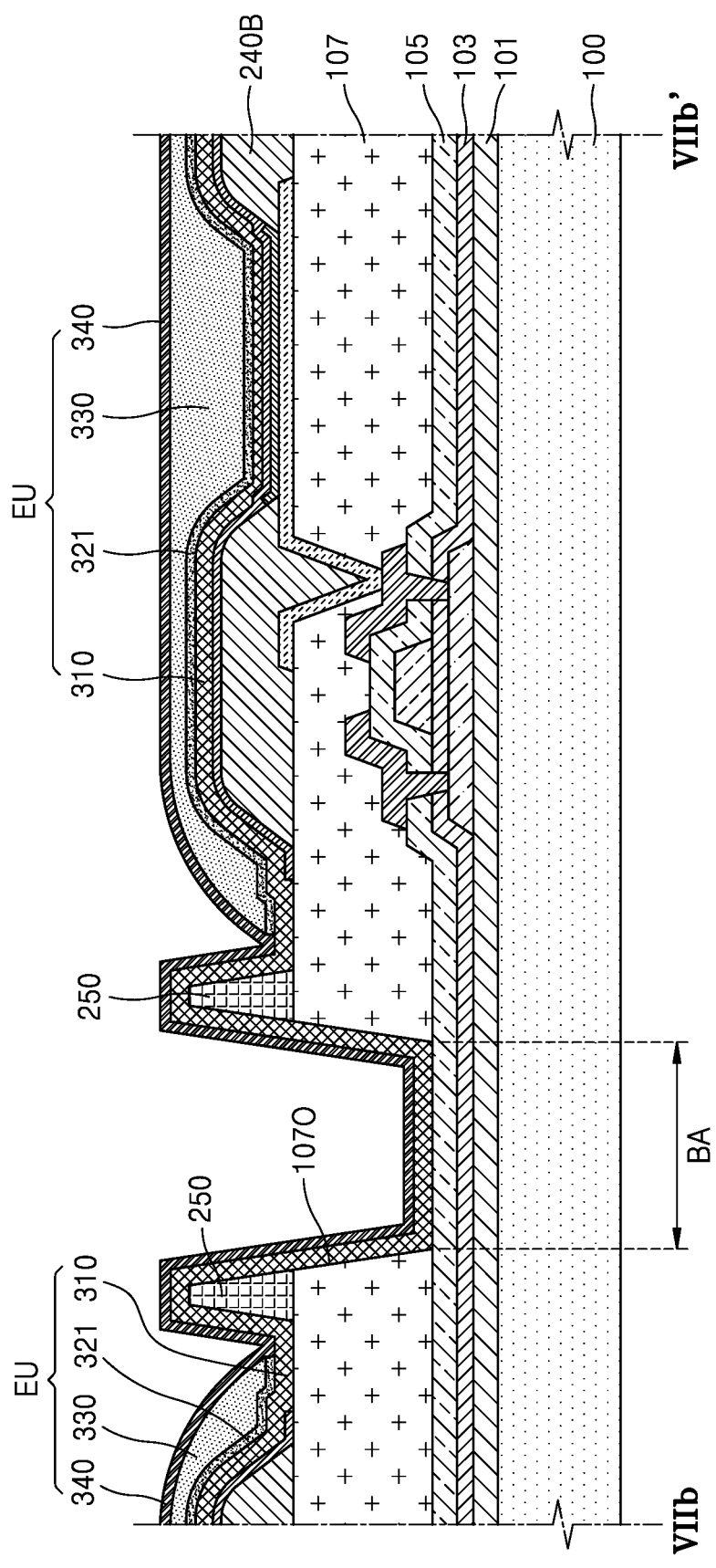
FIG. 13 is a cross-sectional view of the display device taken along line VIIb-VIIb' of FIG. 7 according to an embodiment.
Figure 14:
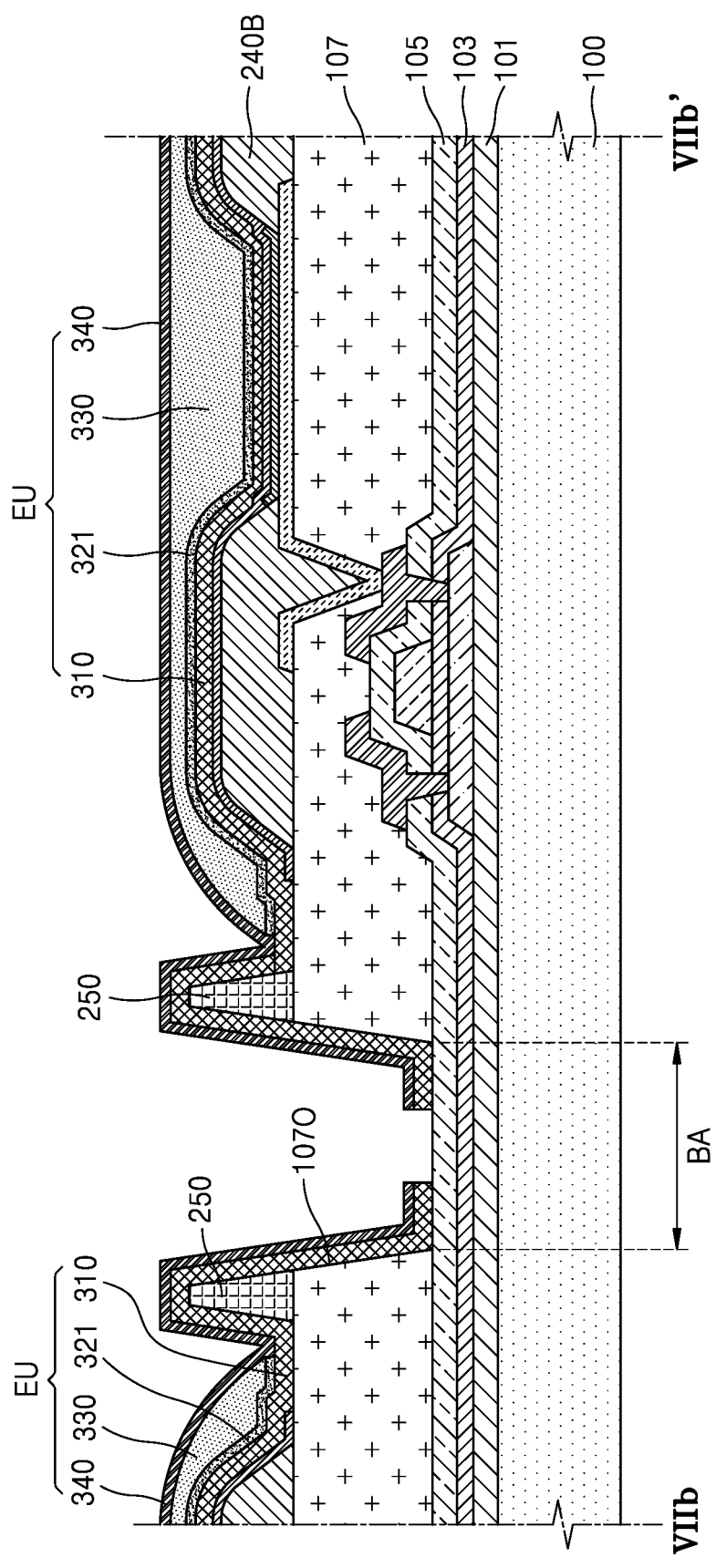
FIG. 14 is a cross-sectional view of the display device taken along line VIIb-VIIb' of FIG. 7 according to an embodiment.

FIG. 13 is a cross-sectional view of the display device taken along line VIIb-VIIb' of FIG. 7 according to an embodiment, and FIG. 14 is a cross-sectional view of the display device taken along line VIIa-VIIa' of FIG. 7 according to an embodiment.

Referring to FIGS. 13 and 14, the organic control layers 321 and the organic encapsulation layers 330 of adjacent unit encapsulation parts EU are disposed in island shapes respectively corresponding to the unit displays PU. The first and second inorganic encapsulation layers 310 and 340 of the adjacent unit encapsulation parts EU may be connected to each other (see FIG. 13) or separated and spaced apart from each other in the separation area BA (see FIG. 14). Also, in the separation area BA, the first inorganic encapsulation layer 310 may contact the interlayer insulating layer 105, which is an inorganic insulating layer, through the through portion 1070 of the organic insulating layer 107 as described above.

As illustrated in FIGS. 13 and 14, a dam 250 may be further disposed on the organic insulating layer 107. The dam 250 may surround the organic control layer 321 and the organic encapsulation layer 330 outside the organic control layer 321 and the organic encapsulation layer 330. During a process of forming the organic encapsulation layer 330, the monomer may be primarily (mainly) controlled by the organic control layer 321, and may be secondarily (subsidiarily) controlled by the dam 250. The dam 250 may include the same material as that of, for example, the pixel-defining layer.

FIGS. 12 and 14 illustrate a stack of the first inorganic encapsulation layers 310 and the second inorganic encapsulation layers 340 of the unit encapsulation parts EU are separated and spaced apart from each other in the separation area BA, and contact the interlayer insulating layer 105 which an inorganic insulating layer under the first inorganic encapsulation layers 310. In another embodiment, while the first inorganic encapsulation layers 310 and the second inorganic encapsulation layers 340 are patterned, inorganic insulating layer(s), for example, at least one of the interlayer insulating layer 105, the gate insulating layer 103, and the buffer layer 101 may be simultaneously patterned.

Figure 15:
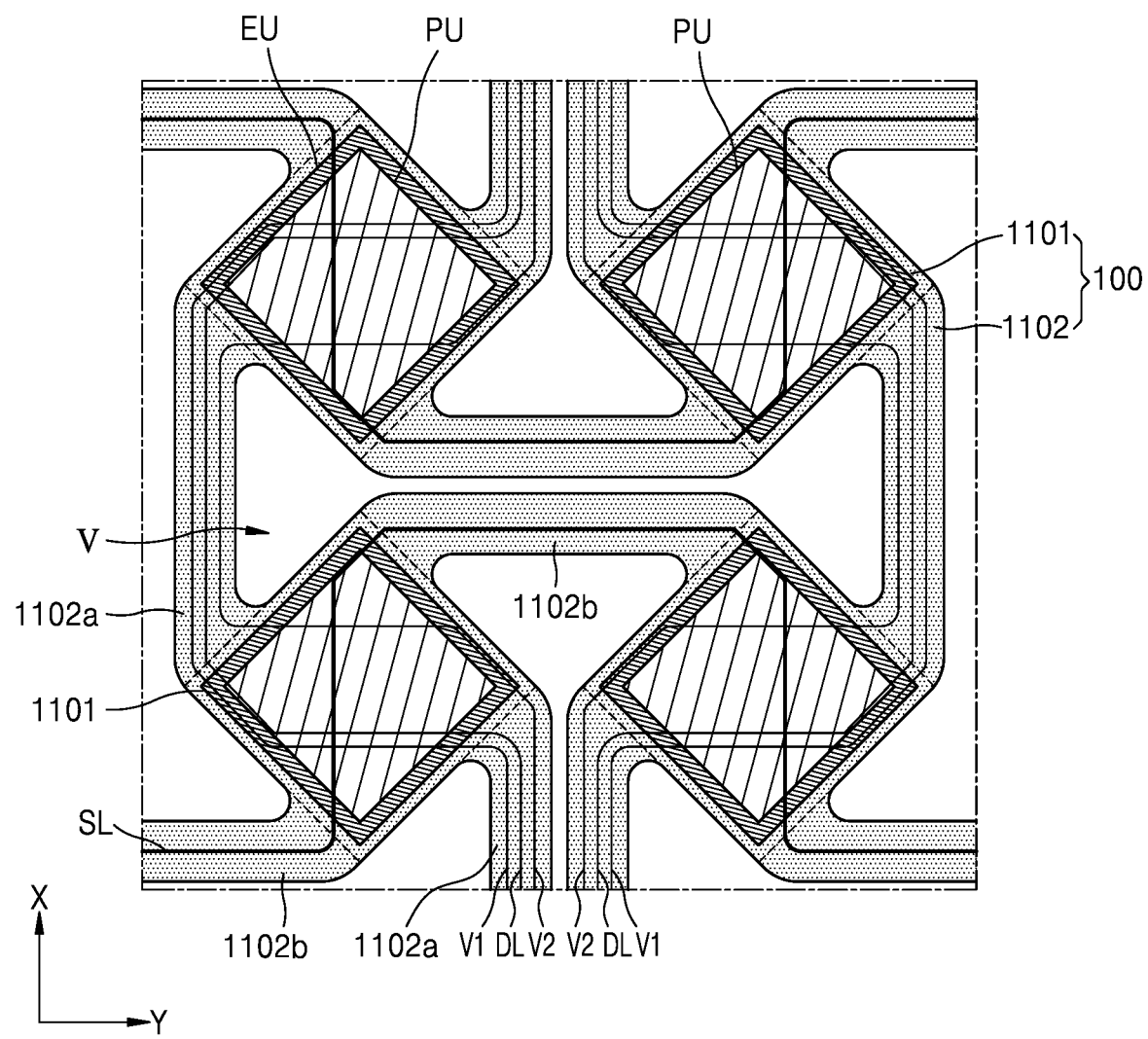
FIG. 15 is a plan view of a wiring in a display device according to an embodiment.

FIG. 15 is a plan view of a wiring in a display device according to an embodiment.

Referring to FIG. 15, wirings, for example, a first voltage line V1, a second voltage line V2, at least one data line DL, and at least one scan line SL may be formed over the substrate 100. The first voltage line V1, the second voltage line V2, the at least one data line DL, and the at least one scan line SL extend to pass by the islands 1101. For example, the first voltage line V1, the second voltage line V2, and the at least one data line DL may extend in the X direction and bent along shapes of the islands 1101 and the connectors 1102 therebetween disposed in the X direction. The at least one scan line SL may extend in the Y direction and bent along shapes of the islands 1101 and the connectors 1102 therebetween disposed in the Y direction.

The opposite electrodes 230 of the unit displays PU described with reference to FIGS. 4 and 6 have structures connected to each other as one body. In contrast, the opposite electrodes 230 of the unit displays PU described with reference to FIGS. 7 and 14 are patterned every unit display PU and thus may be spaced apart from the opposite electrodes 230 of adjacent unit displays PU, and may receive a voltage from a second voltage line V2 described below.

For example, the unit display PU illustrated in FIGS. 7 to 14 includes the thin film transistor TFT and the display elements 200, 200R, 200G, and 200B electrically connected to the thin film transistor TFT. The thin film transistor TFT of each unit display PU may be electrically connected to the first voltage line V1, the data line DL, and the scan line SL. Since the opposite electrode 230 is disposed in an island shape corresponding to each unit display PU, the opposite electrode 230 may receive a preset voltage through the second voltage line V2.

According to embodiments of the present disclosure, since at least one inorganic layer and at least one organic layer of a thin encapsulation layer are formed entirely over a display device, flexibility of the display device may be reduced, and the inorganic layer and the organic layer may be damaged while a shape of the display device changes. It should be understood that the scope of the present disclosure is not restricted by this effect.

Although the disclosure has been described with reference to the embodiments illustrated in the drawings, this is merely provided as an example and it will be understood by those of ordinary skill in the art that various changes in form and details and equivalents thereof may be made therein without departing from the spirit and scope of the disclosure as defined by the following claims.

What is claimed is:

1. A display device comprising:
    a substrate;
    a driving thin film transistor disposed on the substrate;
    a pixel electrode electrically connected to the driving thin film transistor;
    a pixel-defining layer comprising an opening on the pixel electrode wherein the opening is defined by sidewalls of the pixel defining layer;
    an intermediate layer on a portion of the pixel electrode in the opening, the intermediate layer comprising an emission layer;
    an opposite electrode disposed on the intermediate layer;
    an organic control layer on the opposite electrode, the organic control layer disposed in the opening and on the sidewalls of the pixel defining layer, the organic control layer having hydrophilicity;
    an organic encapsulation layer disposed on the organic control layer, the organic control layer disposed between the opposite electrode and the organic encapsulation layer; and
    at least one inorganic encapsulation layer overlapping the organic encapsulation layer.

2. The display device of claim 1, wherein the at least one inorganic encapsulation layer comprises:
    a first inorganic encapsulation layer disposed between the opposite electrode and the organic control layer; and
    a second inorganic encapsulation layer disposed on the organic encapsulation layer such that the organic encapsulation layer is disposed between the first inorganic encapsulation layer and the second inorganic encapsulation layer.

3. The display device of claim 2, wherein the first inorganic encapsulation layer contacts the second inorganic encapsulation layer in a region adjoining an end of the organic encapsulation layer.

4. The display device of claim 1, further comprising:
    an adjacent pixel electrode adjoining the pixel electrode;
    an adjacent intermediate layer disposed on the adjacent pixel electrode, the adjacent intermediate layer comprising an adjacent emission layer configured to emit light of color different from color of light emitted from the emission layer of the intermediate layer; and
    an adjacent opposite electrode disposed on the adjacent intermediate layer.

5. The display device of claim 4, further comprising:
    an adjacent organic control layer disposed on the opposite electrode, the adjacent organic control layer having hydrophilicity;
    an adjacent organic encapsulation layer directly contacting the adjacent organic control layer; and
    at least one adjacent inorganic encapsulation layer overlapping the adjacent organic encapsulation layer,
    wherein the adjacent organic control layer and the organic control layer are mutually spaced apart, and the adjacent organic encapsulation layer and the organic encapsulation layer are mutually spaced apart.

6. The display device of claim 4, wherein the adjacent opposite electrode and the opposite electrode are connected as one body.

7. The display device of claim 4, wherein the adjacent opposite electrode and the opposite electrode are spaced apart.

8. The display device of claim 5, wherein the at least one adjacent inorganic encapsulation layer and the at least one inorganic encapsulation layer are connected as one body.

9. The display device of claim 5, wherein the at least one adjacent inorganic encapsulation layer and the at least one inorganic encapsulation layer are mutually spaced apart.

10. A display device comprising:
    a substrate;
    a plurality of unit displays disposed over the substrate, each comprising a pixel electrode, an intermediate layer, and an opposite electrode stacked, the intermediate layer comprising an emission layer;
    pixel defining layer portions between neighboring unit displays;
    an organic control layer on each of the unit displays between tops of the pixel defining layer portions, the organic control layer having hydrophilicity;

an organic encapsulation layer being in direct contact with the organic control layer; and at least one inorganic encapsulation layer overlapping the organic encapsulation layer.

11. The display device of claim 10, wherein the at least one inorganic encapsulation layer comprises:

a first inorganic encapsulation layer disposed between each of the unit displays and the organic control layer; and a second inorganic encapsulation layer disposed on the organic encapsulation layer such that the organic encapsulation layer is disposed between the second inorganic encapsulation layer and the first inorganic encapsulation layer.

12. The display device of claim 10, wherein the organic encapsulation layer comprises a plurality of sub-organic encapsulation layers corresponding to each of the unit displays.

13. A method of manufacturing a display device, the method comprising:

forming, over a substrate, a thin film transistor and a pixel electrode electrically connected to the thin film transistor;

forming a pixel-defining layer comprising an opening exposing the pixel electrode wherein the opening is defined by sidewalls of the pixel defining layer;

forming an intermediate layer comprising an emission layer, the intermediate layer overlapping a portion of the pixel electrode exposed through the opening;

forming an opposite electrode on the intermediate layer;

forming an organic control layer on the opposite electrode, the organic control layer disposed in the opening and on the sidewalls of the pixel defining layer, the organic control layer comprising a first region having hydrophilicity;

forming an organic encapsulation layer on the first region, the organic control layer disposed between the opposite electrode and the organic encapsulation layer; and forming at least one inorganic encapsulation layer overlapping the organic encapsulation layer.

14. The method of claim 13, wherein the forming of the organic control layer comprises:

forming an organic material layer having hydrophilicity that changes in response to irradiation; and forming the organic control layer by irradiating a preselected light onto a portion of the organic material layer, the organic control layer further comprising a second region having hydrophobicity.

15. The method of claim 14, further comprising: removing the second region.

16. The method of claim 14, wherein the organic material layer comprises an organic material comprising at least one of an azobenzene group, a spiropyran amine group, a 7-[(trifluoro methylphenylazo)phenoxy]pentanoic acid group, a cinnamate group, a trifluoromethanesulfonic acid trimethylsilylester group, a polyarylsulfone, a diarylethene group, a diethylcyclopentene group, a coumarin group, or an ortho-nitrobenzyl (ONB) ester group.

17. The method of claim 14, wherein a width of the first region is greater than a width of the opening.

18. The method of claim 13, wherein the forming of the at least one inorganic encapsulation layer comprises:

forming a first inorganic encapsulation layer disposed between the opposite electrode and the organic control layer; and forming a second inorganic encapsulation layer on the organic encapsulation layer such that the organic encapsulation layer is disposed between the first inorganic encapsulation layer and the second inorganic encapsulation layer.

19. The method of claim 13, further comprising:

etching the at least one inorganic encapsulation layer such that the at least one inorganic encapsulation layer has an island shape.

* * * * *